United States Patent
Mishra et al.

(10) Patent No.: US 8,466,460 B2
(45) Date of Patent: Jun. 18, 2013

(54) FUSED BITHIOPHENE-VINYLENE POLYMERS

(75) Inventors: Ashok Kumar Mishra, Singapore (SG); Subramanian Vaidyanathan, Singapore (SG); Hiroyoshi Noguchi, Singapore (SG); Florian Doetz, Singapore (SG); Silke Annika Koehler, Basel (CH); Marcel Kastler, Basel (CH)

(73) Assignees: BASF SE, Ludwigshafen (DE); Polyera Corporation, Skokie, IL (US)

( * ) Notice: Subject to any disclaimer, the term of this patent is extended or adjusted under 35 U.S.C. 154(b) by 0 days.

(21) Appl. No.: 13/376,296

(22) PCT Filed: May 26, 2010

(86) PCT No.: PCT/EP2010/057225
§ 371 (c)(1),
(2), (4) Date: Dec. 5, 2011

(87) PCT Pub. No.: WO2010/149451
PCT Pub. Date: Dec. 29, 2010

(65) Prior Publication Data
US 2012/0074410 A1  Mar. 29, 2012

Related U.S. Application Data

(60) Provisional application No. 61/305,558, filed on Feb. 18, 2010.

(30) Foreign Application Priority Data

Jun. 5, 2009  (EP) ..................... 09162087
Jan. 14, 2010  (EP) ..................... 10150780

(51) Int. Cl.
*H01L 51/00* (2006.01)
*H01L 29/08* (2006.01)

(52) U.S. Cl.
USPC ...... 257/40; 257/103; 257/289; 257/E51.005; 257/E51.012; 257/E51.018; 257/E51.027

(58) Field of Classification Search
USPC ............ 257/40, 103, 289, E51.005, E51.012, 257/E51.018, E51.027
See application file for complete search history.

(56) References Cited

U.S. PATENT DOCUMENTS 7,667,230 B2 * 2/2010 Zhu et al. ........................ 257/40
8,097,348 B2 * 1/2012 Luebben et al. .............. 428/690
(Continued)

FOREIGN PATENT DOCUMENTS

| EP | 1 279 691 | 1/2003 |
|---|---|---|
| EP | 1 284 276 | 2/2003 |
| WO | 96 21659 | 7/1996 |

OTHER PUBLICATIONS

Ong, B. S., et al., "High-Performance Semiconducting Polythiophenes for Organic Thin-Film Transistors," Journal of American Chemical Society, vol. 126, pp. 3378-3379, (2004).

(Continued)

*Primary Examiner* — Ngan Ngo
(74) *Attorney, Agent, or Firm* — Oblon, Spivak, McClelland, Maier & Neustadt, L.L.P.

(57) ABSTRACT

A polymer comprising repeating units A and optionally repeating units B wherein Z=S, Se, N—R and O; W is at each occurrence independently a monocyclic or polycylic moiety optionally substituted with 1-4 $R^a$ groups; Y, at each occurrence, is independently a divalent $C_{1-6}$ alkyl group, a divalent $C_{1-6}$ haloalkyl group, or a covalent bond; c is from 1 to 6.

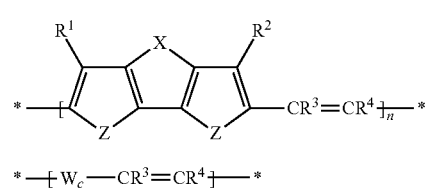

19 Claims, 6 Drawing Sheets

U.S. PATENT DOCUMENTS

| | | | |
|---|---|---|---|
| 2007/0187673 A1* | 8/2007 | Zheng et al. | 257/40 |
| 2007/0215864 A1* | 9/2007 | Luebben et al. | 257/40 |
| 2008/0164465 A1* | 7/2008 | Van Breemen et al. | 257/40 |
| 2009/0221740 A1* | 9/2009 | Sheina | 524/548 |
| 2010/0102299 A1* | 4/2010 | Murase et al. | 257/40 |
| 2011/0136973 A1 | 6/2011 | Kastler et al. | |
| 2011/0155248 A1 | 6/2011 | Kastler et al. | |
| 2011/0168264 A1 | 7/2011 | Kastler et al. | |

OTHER PUBLICATIONS

McCulloch, I., et al., "Liquid-crystalline semiconducting polymers with high charge-carrier mobility," Nature Materials, vol. 5, pp. 328-333, (Apr. 2006).

Pan, H., et al., "Benzodithiophene Copolymer—A Low-Temperature, Solution-Processed High-Performance Semiconductor for Thin-Film Transistors," Advaned Functional Materials, vol. 17, pp. 3574-3579, (2007).

Burroughes, J. H , et al., "Light-emitting diodes based on conjugated polymers," Nature, International Weekly Journal of Science, vol. 347, No. 6292, pp. 539-541, (Oct. 11, 1990).

Kraft, A., et al., "Electroluminescent Conjugated Polymers—Seeing Polymers in a New Light," Angewandte Chemie International Edition, vol. 37, pp. 402-428, (1998).

Fuchigami, H., et al., "Polythienylenevinylene thin-film transistor with high carrier mobility," Applied Physics Letters, vol. 63, No. 10, pp. 1372-1374, (Sep. 6, 1993).

Prins, P., et al., "Electron and Hole Dynamics on Isolated Chains of a Solution-Processable Poly(thienylenevinylene) Derivative in Dilute Solution," Advanced Materials, vol. 17, No. 6, pp. 718-723, (Mar. 22, 2005).

Gillissen, S., et al., "Synthesis of a Processible High Molecular Weight Poly(thienylene vinylene). Polymerisation and Thin-Film Transistor Properties.," Synthetic Metals, vol. 135-136, pp. 255-256, (2003).

Yamada, S., et al., "New Conducting Polymer Film: Poly(2,5-thienylenevinylene) prepared via a Soluble Precursor Polymer," Journal of the Chemical Society, Chemical Communications, No. 19, pp. 1448-1449, (1987).

International Search Report Issued Sep. 14, 2010 in PCT/EP10/057225, filed May 26, 2010.

U.S. Appl. No. 61/188,744, filed Aug. 11, 2008, Kastler, et al.

U.S. Appl. No. 13/140,595, filed Jun. 17, 2011, Mishra, et al.

* cited by examiner

FUSED BITHIOPHENE-VINYLENE POLYMERS

BACKGROUND

The present invention concerns fused bithophene-vinylene polymers, a thin film semiconductor, as well as electronic, optical and optoelectronic devices containing the polymers.

Since the beginning of the electronic era, the primary building blocks in electronics and microelectronics have been field-effect transistors (FETs) based on inorganic electrodes, insulators, and semiconductors. These materials have proven to be reliable and highly efficient, providing performance that improves continually according to Moore's law. More recently, organic materials have been developed as both active and passive materials in electronic circuitry. Instead of competing with conventional silicon technologies, organic FETs (OFETs) based on molecular and polymeric materials are desired in niche applications, for example, in low-end radio-frequency technologies, sensors, and light emission, as well as in integrated optoelectronic devices such as pixel drives and switching elements in displays. These systems have been widely pursued for the advantages they offer, which include processability via vapor/solution-phase fabrication, good compatibility with different substrates (e.g., flexible plastics), and opportunities for structural tailoring. This trend is further driven by the continued demand for low-cost, large-area, flexible and lightweight devices, and the possibility to process these materials at much lower substrate temperatures compared to inorganic semiconductors.

The simplest and most common OFET device configuration is that of a thin-film transistor (TFT), in which a thin film of the organic semiconductor is deposited on top of a dielectric with an underlying gate (G) electrode. Charge-injecting drain-source (D-S) electrodes providing the contacts are defined either on top of the organic film (top-configuration) or on the surface of the FET dielectric prior to the deposition of the semiconductor (bottom-configuration). The current between the S and D electrodes is low when no voltage ($V_g$) is applied between the G and D electrodes, and the device is in the so called "off" state. When $V_g$ is applied, charges can be induced in the semiconductor at the interface with the dielectric layer. As a result, current ($I_d$) flows in the channel between the S and D electrodes when a source-drain bias ($V_d$) is applied, thus providing the "on" state of a transistor. Key parameters in characterizing FET performance are the field-effect mobility ($\mu$), which quantifies the average charge carrier drift velocity per unit electric field, and the current on/off ratio ($I_{on}:I_{off}$), which is the D-S current ratio between the "on" and "off" states. For a high-performance OFET, the field-effect mobility and on/off ratio should both be as high as possible, for example, having at least $\mu \sim 0.1\text{-}1\ cm^2V^{-1}s^{-1}$ and $I_{on}/I_{off} \sim 10^6$.

Most OFETs operate in p-type accumulation mode, meaning that the semiconductor acts as a hole-transporting material. For most practical applications, the mobility of the field-induced charges should be greater than about $0.01\ cm^2/Vs$. To achieve high performance, the organic semiconductors should satisfy stringent criteria relating to both the injection and current-carrying capacity; in particular: (i) the HOMO/LUMO energies of the material should be appropriate for hole/electron injection at practical voltages; (ii) the crystal structure of the material should provide sufficient overlap of the frontier orbitals (e.g., π-stacking and edge-to-face contacts) to allow charges to migrate among neighboring molecules; (iii) the compound should be very pure as impurities can hinder the mobility of charge carriers; (iv) the conjugated core of the material should be preferentially oriented to allow charge transport in the plane of the TFT substrate (the most efficient charge transport occurs along the direction of intermolecular π-π stacking); and (v) the domains of the crystalline semiconductor should uniformly cover the area between the source and drain contacts, hence the film should have a single crystal-like morphology.

Among the organic p-type semiconductors used in OFETs, the classes of (oligo, poly)thiophenes and acenes are the most investigated. For instance, the first report on a polyheterocycle-based FET was on polythiophene, and poly(3-hexyl)thiophene and α,ω-dialkyloligothiophenes were the first high-mobility polymer and small molecules, respectively. Over the years, chemical modifications of the π-conjugated core, variations in ring-to-ring connectivity and substitution pattern have resulted in the synthesis and testing of a considerable number of semiconducting materials with improved mobilities.

In order to take full advantage of the cost effciencies of solution processing methods such as spin coating, stamping, ink-jet printing or mass printing such as gravure and offset printing, polymeric organic semiconductors would seem to be the material of choice. Among polythiophenes, soluble regioregular polythiophenes such as poly(3-hexylthiophenes) (P3HT), or poly(3,3'''-didodecylquaterthiophene), poly(2,5-bis-(3-dodecylthiophen-2-yl)-thieno-(3,2-b) thiophene, poly(4,8-didodecyl-2,6-bis-(3-methylthiophen-2-yl)benzo[1,2-b:4,5-b']dithiophene) and their variants are most promising for OTFT applications due to their high charge carrier mobilities. See for eg. Ong, B. S. et al. *J. Am. Chem. Soc.* 2004, 126, 3378-3379; McCulloch, I. et. al. *Nat. Mater.* 2006, 5, 328-333 and Pan, H. et. al. *Adv. Funct. Mater.* 2007, 17, 3574-3579.

Another drawback with the state-of-the-art high performing semiconductors is the poor solubility in common organic solvents at room temperature. These polymers are sufficiently soluble only in high boiling point chlorinated solvents such as dichlorobenzene and sometimes only at elevated temperature.

An important requirement for the semiconducting material in solar cell is that it should absorb a significant fraction of the sun's light. Most of the organic semiconducting materials have fairly large band gaps and the absorption bandwidth of these materials is too narrow to absorb a large fraction of the solar spectrum. It is desirable to have a semiconducting material which absorbs further into the visible red and near IR region of the electromagnetic spectrum and has a broad absorption bandwidth.

Among the earliest reports of semiconducting polymers are poly(paraphenylenevinylene)s (PPVs) and their derivatives used as active materials in organic light emitting diodes (OLEDs). See eg. Burroughes, J. H. et al. Nature 1990, 347, 539-541 and Kraft, A. et al. Angew. Chem. Int. Ed. 1998, 37, 402-428. PPVs have a relatively large band gap, and poor hole mobilities. For this reason, PTVs and its derivatives were adopted for use in OTFTs. See eg. Fuchigami, H. T. et al. *Appl. Phys. Lett.* 1993, 63, 1372; Prins, P. et. al *Adv. Mater.* 2005, 17, 718; Gillissen, S. et al. *Synth. Met.* 2003, 135-136, 255 and Yamada, S. *J. Chem. Soc., Chem. Commun.* 1987, 1448.

U.S. Pat. No. 6,645,401 discloses conjugated polymers comprising one dithienothiophene recurring unit and a vinylene or acetylene recurring unit, wherein the dithienothiophene is substituted by one or two halogen, aryl, heteroaryl, or straight chain, branched or cyclic alkyl groups, and the vinylene group is unsubstituted or substituted by one or two groups selected from F, Cl an CN. The polymers are said to be useful as optical, electronic and semiconductor materials, in particular as charge transport materials in field effect transistors, as photovoltaics or sensor materials.

SUMMARY

In light of the foregoing, it is an object of the present invention to provide organic semiconductor materials and associated compositions, composites, and/or devices that can address various deficiencies and shortcomings of the state-of-the-art, including those outlined above.

The present invention provides polymers having semiconducting activity and semiconductor materials prepared from these polymer. The polymers of the present invention contain repeating units A and optionally repeating units B:

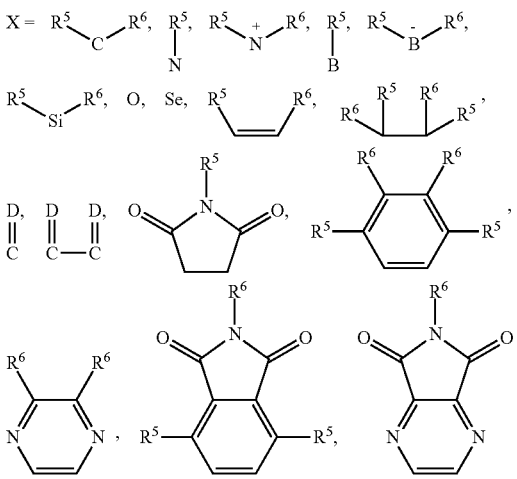

wherein
Z=S, Se, N—R and O;

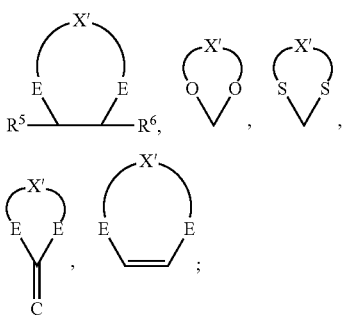

D=O, C(CN)$_2$, CR$^4$R$^5$;
E=CR$^4$R$^5$, NR$^4$, O, S;

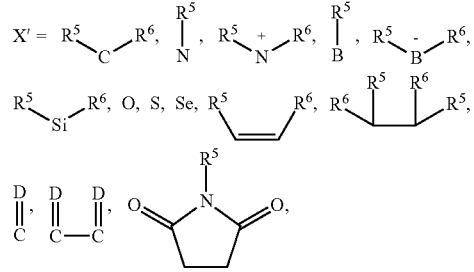

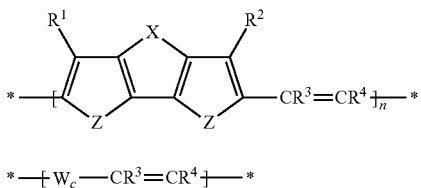

wherein:
W is at each occurrence independently a monocyclic or polycylic moiety optionally substituted with 1-4 R$^a$ groups;
wherein:
R$^a$, at each occurrence, is independently a) a halogen, b) —CN, c) —NO$_2$, d) oxo, e) —OH, f) =C(R$^b$)$_2$, g) a C$_{1-20}$ alkyl group, h) a C$_{2-20}$ alkenyl group, i) a C$_{2-20}$ alkynyl group, j) a C$_{1-20}$ alkoxy group, k) a C$_{1-20}$ alkylthio group, l) a C$_{1-20}$ haloalkyl group, m) a —Y—C$_{3-10}$ cycloalkyl group, n) a —Y—C$_{6-14}$ aryl group, o) a —Y-3-12 membered cycloheteroalkyl group, or p) a —Y-5-14 membered heteroaryl group, wherein each of the C$_{1-20}$ alkyl group, the C$_{2-20}$ alkenyl group, the C$_{2-20}$ alkynyl group, the C$_{3-10}$ cycloalkyl group, the C$_{6-14}$ aryl or haloaryl group, the 3-12 membered cycloheteroalkyl group, and the 5-14 membered heteroaryl group is optionally substituted with 1-4 R$^b$ groups;
R$^b$, at each occurrence, is independently a) a halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)—C$_{6-14}$ aryl, j) —N(C$_{6-14}$ aryl)$_2$, k) —S(O)$_m$H, l) —S(O)$_m$—C$_{1-20}$ alkyl, m) —S(O)$_2$OH, n) —S(O)$_m$—OC$_{1-20}$ alkyl, o) —S(O)$_m$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)—C$_{6-14}$ aryl, aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)—C$_{6-14}$ aryl, ag) —C(S)NH—C$_{6-14}$ aryl, ah) —S(O)$_m$NH$_2$, ai) —S(O)$_m$NH(C$_{1-20}$ alkyl), aj) —S(O)$_m$N(C$_{1-20}$ alkyl)$_2$, ak) —S(O)$_m$NH(C$_{6-14}$ aryl), al) —S(O)$_m$N(C$_{1-20}$ alkyl)—C$_{6-14}$ aryl, am) —S(O)$_m$N(C$_{6-14}$ aryl)$_2$, an) SiH$_3$, ao) SiH(C$_{1-20}$ alkyl)$_2$, ap) SiH$_2$(C$_{1-20}$ alkyl), ar) —Si(C$_{1-20}$ alkyl)$_3$, as) a C$_{1-20}$ alkyl group, at) a C$_{2-20}$ alkenyl group, au) a C$_{2-20}$ alkynyl group, av) a C$_{1-20}$ alkoxy group, aw) a C$_{1-20}$ alkylthio group, ax) a C$_{1-20}$ haloalkyl group, ay) a C$_{3-10}$ cycloalkyl group, az) a C$_{6-14}$ aryl or haloaryl group, ba) a 3-12 membered cycloheteroalkyl group, or bb) a 5-14 membered heteroaryl group;
Y, at each occurrence, is independently a divalent C$_{1-6}$ alkyl group, a divalent C$_{1-6}$ haloalkyl group, or a covalent bond; and
m, at each occurrence, is independently 0, 1 or 2;
R, R$^1$, R$^2$, R$^5$, R$^6$, at each occurrence, are independently H, CN, a C$_{1-30}$ alkyl group, a C$_{2-30}$ alkenyl group, a C$_{1-30}$ haloalkyl group, -L-Ar$^1$, -L-Ar$^1$-Ar$^1$, -L-Ar$^1$—R$^7$, or -L-Ar$^1$—Ar$^1$—R$^7$;
wherein:
L, at each occurrence, is independently —O—, —Y—O—Y—, —S—, —S(O)—, —Y—S—Y—, —C(O)—, —NR$^c$C(O)—, —NR$^c$—, —[SiR$^c_2$]—, —Y—

[SiR$^c{}_2$]—Y—, a divalent C$_{1\text{-}30}$ alkyl group, a divalent C$_{1\text{-}30}$ alkenyl group, a divalent C$_{1\text{-}30}$ haloalkyl group, or a covalent bond;

wherein:

R$^c$, at each occurrence, is H, a C$_{1\text{-}20}$ alkyl group, or a —Y—C$_{6\text{-}14}$ aryl group;

Ar$^1$, at each occurrence, is independently a C$_{6\text{-}14}$ aryl group or a 5-14 membered heteroaryl group, each optionally substituted with 1-5 substituents selected from a halogen, —CN, a C$_{1\text{-}6}$ alkyl group, a C$_{1\text{-}6}$ alkoxy group, and a C$_{1\text{-}6}$ haloalkyl group; and R$^7$, at each occurrence, is independently a C$_{1\text{-}20}$ alkyl group, a C$_{2\text{-}20}$ alkenyl group, a C$_{1\text{-}20}$ haloalkyl group, a C$_{1\text{-}20}$ alkoxy group, -L'-Ar$^2$, -L'-Ar$^2$—Ar$^2$, -L'-Ar$^2$—R$^8$, or -L'-Ar$^2$—Ar$^2$—R$^8$;

wherein:

L', at each occurrence, is independently —O—, —Y—O—Y—, —S—, —S(O)—, —Y—S—Y—, —C(O)—, —NR$^c$C(O)—, —NR$^c$—, —SiR$^c{}_2$—, —Y—[SiR$^c{}_2$]—Y—, a divalent C$_{1\text{-}20}$ alkyl group, a divalent C$_{1\text{-}20}$ alkenyl group, a divalent C$_{1\text{-}20}$ haloalkyl group, or a covalent bond;

Ar$^2$, at each occurrence, is independently a C$_{6\text{-}14}$ aryl group or a 5-14 membered heteroaryl group, each optionally substituted with 1-5 substituents selected from a halogen, —CN, a C$_{1\text{-}6}$ alkyl group, a C$_{1\text{-}6}$ alkoxy group, and a C$_{1\text{-}6}$ haloalkyl group; and R$^8$, at each occurrence, is a C$_{1\text{-}20}$ alkyl group, a C$_{2\text{-}20}$ alkenyl group, a C$_{1\text{-}20}$ haloalkyl group, or a C$_{1\text{-}20}$ alkoxy group;

Y, at each occurrence, is independently a divalent C$_{1\text{-}6}$ alkyl group, a divalent C$_{1\text{-}6}$ haloalkyl group, or a covalent bond;

R$^3$, R$^4$, at each occurrence, are independently H, CN, a C$_{1\text{-}30}$ alkyl group, a C$_{2\text{-}30}$ alkenyl group, a C$_{1\text{-}30}$ haloalkyl group, or -L-R$^9$;

wherein:

L, at each occurrence, is independently —O—, —Y—O—Y—, —S—, —S(O)—, —Y—S—Y—, —C(O)—, —NR$^{c'}$C(O)—, —NR$^{c'}$—, a divalent C$_{1\text{-}30}$ alkyl group, a divalent C$_{1\text{-}30}$ alkenyl group, a divalent C$_{1\text{-}30}$ haloalkyl group, or a covalent bond;

wherein:

R$^{c'}$, at each occurrence, is H, a C$_{1\text{-}20}$ alkyl group,

R$^9$, at each occurrence, is independently a C$_{1\text{-}20}$ alkyl group, a C$_{2\text{-}20}$ alkenyl group, a C$_{1\text{-}20}$ haloalkyl group;

Y, at each occurrence, is independently a divalent C$_{1\text{-}6}$ alkyl group, a divalent C$_{1\text{-}6}$ haloalkyl group, or a covalent bond;

and c is from 1 to 6.

It has been found that introduction of vinylene linkage in polymer backbone reduces the band gap as well as broadens the absorption spectrum. Furthermore, planarization of the polymer chain by bridging the thiophene units leads to a redshift in the absorption maxima and results in a better inter-molecular charge transport.

In some embodiments, Z in unit A is S. In some embodiments, X in unit A is N(R$^5$) or Si(R$^5$R$^6$). In some embodiments, Z in unit A is S and X is N(R$^5$) or Si(R$^5$R$^6$). In many embodiments, R$^5$ and R$^6$ are a C$_{1\text{-}30}$ alkyl or a C$_{2\text{-}30}$ alkenyl group. In some preferred embodiments, R$^1$, R$^2$, R$^3$ and R$^4$ are hydrogen.

In a number of embodiments, R, R$^1$, R$^2$, R$^5$, R$^6$ are independently H, CN, a C$_{1\text{-}30}$ alkyl group, a C$_{2\text{-}30}$ alkenyl group, or a C$_{1\text{-}30}$ haloalkyl group. In a number of embodiments, R$^3$, R$^4$ are independently H, CN, a C$_{1\text{-}30}$ alkyl group, a C$_{2\text{-}30}$ alkenyl group, or a C$_{1\text{-}30}$ haloalkyl group.

In some preferred embodiments, R, R$^1$, R$^2$, R$^3$, R$^4$, R$^5$ and R$^6$ are independently selected from H, CN, a C$_{1\text{-}30}$ alkyl group, a C$_{2\text{-}30}$ alkenyl group, and a C$_{1\text{-}30}$ haloalkyl group.

In some preferred embodiments, R$^5$ and R$^6$ are a C$_{1\text{-}30}$ alkyl or C$_{1\text{-}30}$ haloalkyl or a C$_{2\text{-}30}$ alkenyl group. In some other preferred embodiments, R$^1$, R$^2$, R$^3$ and R$^4$ are hydrogen. In some specific embodiments, R$^5$ and R$^6$ are a C$_{1\text{-}30}$ alkyl or C$_{1\text{-}30}$ haloalkyl or a C$_{2\text{-}30}$ alkenyl group, and R$^1$, R$^2$, R$^3$ and R$^4$ are hydrogen.

In some embodiments, Z in unit A is S. In some embodiments, X in unit A is N(R$^5$) or Si(R$^5$R$^6$). In some specific embodiments, Z in unit A is S and X is N(R$^5$) or Si(R$^5$R$^6$).

In some specific examples, Z in unit A is S, X is N(R$^5$) or Si(R$^5$R$^6$), R$^5$ and R$^6$ are a C$_{1\text{-}30}$ alkyl, a C$_{1\text{-}30}$ haloalkyl or a C$_{2\text{-}30}$ alkenyl group, and R$^1$, R$^2$, R$^3$ and R$^4$ are hydrogen.

In some embodiments, the polymer of the present invention is a homopolymer containing A units. In some embodiments, the polymer of the present invention is a copolymer containing A and B units. The A and B units can be present in random order (random copolymers) or in alternating order (alternating copolymers). In case of random copolymers, the molar ratio of A:B is in general from 0.2:0.8 to 0.8:0.2, preferably from 0.3:0.7 to 0.7:0.3.

The average number n of the monomer units A or comonomer units A and B is in general from 2 to 5000. Preferably, n is from 18 to 5000.

In some embodiments, the polymer of the invention is a homopolymer or an alternating copolymer of the general formula (I)

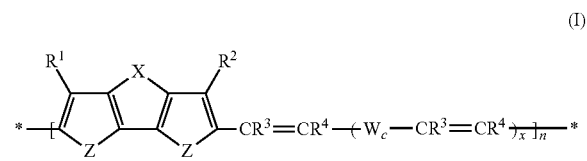

wherein Z, X, W$_c$, R$^1$, R$^2$, R$^3$, R$^4$ are as defined above, and x is 0 or 1, and n is an integer greater than 1.

It should be understood that the polymers of the present invention can be referred to herein as either polymers or copolymers. Further, the polymers can be embedded with other components for utilization in other semiconductor-based devices. The polymers of the present invention can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

The polymers of the present invention can exhibit semiconductor behavior such as high carrier mobility and/or good current modulation characteristics in a field-effect device, and light absorption/charge separation in a photovoltaic device. Similarly, other organic semiconductor based devices such as OPVs, OLETs, and OLEDs can be fabricated efficiently using the polymeric materials described herein. In addition, the present polymers can possess certain processing advantages such as solution-processability high mobility and/or a wide absorption spectrum.

The present invention also provide methods of preparing such polymers and semiconductor materials, as well as various compositions, composites, and devices that incorporate the polymers and semiconductor materials disclosed herein.

The foregoing as well as other features and advantages of the present teachings, will be more fully understood from the following figures, description, and claims.

BRIEF DESCRIPTION OF DRAWINGS

It should be understood that the drawings described below are for illustration purpose only. The drawings are not necessarily to scale and are not intended to limit the scope of the present teachings in any way.

Figure 1:
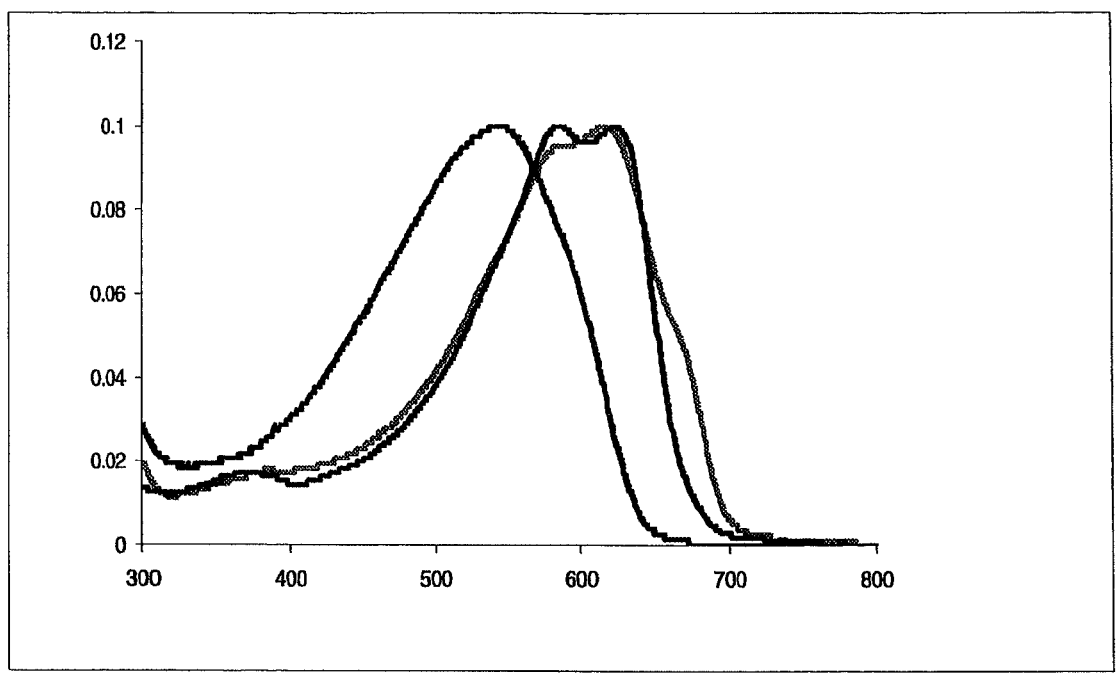
FIG. 1 shows the UV-Vis spectrum of poly(dithienosilole-vinylene) P3, poly(dithienopyrrole) P4, and—for comparison—poly(bithiophene-vinylene) P5 as dilute solutions. Absorbance (ordinate) is plotted versus wavelength in nm (abscissa).

Table 1 summarizes the structure, the material for the different components, and the method of fabrication of various exemplary TFTs incorporating representative polymers of the present teachings.

The present invention relates to semiconductor materials prepared from fused bithiophene-vinylene polymers. The present invention further relates to methods for preparing these copolymers and semiconductor materials, as well as to compositions, composites, materials, articles, structures, and devices that incorporate such copolymers and semiconductor materials.

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

As used herein, a "p-type semiconductor material" or "p-type semiconductor" refers to a semiconducting material, for example, an organic semiconducting material, having holes as the majority current carriers. In some embodiments, when deposited on a substrate, a p-type semiconductor can provide a hole mobility in excess of about $10^{-5}$ cm$^2$/Vs. In the case of field-effect devices, a p-type semiconductor material also should exhibit a current on/off ratio of greater than about 1000.

As used herein, a "n-type semiconductor material" or "n-type semiconductor" refers to a semiconducting material, for example, an organic semiconducting material, having electrons as the majority current carriers. In some embodiments, when deposited on a substrate, an n-type semiconductor can provide an electron mobility in excess of about $10^{-5}$ cm$^2$/Vs. In the case of field-effect devices, a n-type semiconductor material also should exhibit a current on/off ratio of greater than about 1000.

As used herein, "solution-processable" refers to compounds, materials, or compositions that can be used in various solution-phase processes including spin-coating, printing (e.g., inkjet printing, gravure printing, offset printing), spray coating, electrospray coating, drop casting, dip coating, and blade coating.

As used herein, a "fused ring" or a "fused ring moiety" refers to a polycyclic ring system having at least two rings wherein at least one of the rings is aromatic and such aromatic ring (carbocyclic or heterocyclic) has a bond in common with at least one other ring that can be aromatic or non-aromatic, and carbocyclic or heterocyclic.

As used herein, a "cyclic moiety" can include one or more (e.g., 1-6) carbocyclic or heterocyclic rings. In embodiments where the cyclic moiety is a polycyclic moiety, the polycyclic system can include one or more rings fused to each other (i.e., sharing a common bond) and/or connected to each other via a spiro atom. The cyclic moiety can be a cycloalkyl group, a heterocycloalkyl group, an aryl group, or a heteroaryl group, and can be optionally substituted as described herein.

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl), and the like. In various embodiments, an alkyl group can have 1 to 20 carbon atoms, i.e., a $C_{1-20}$ alkyl group. In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g., n-butyl, isobutyl, sec-butyl, tert-butyl). In some embodiments, alkyl groups can be substituted as disclosed herein. An alkyl group is generally not substituted with another alkyl group or an alkenyl or alkynyl group.

As used herein, "haloalkyl" refers to an alkyl group having one or more halogen substituents. Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula $-C_mX_{2t}-$ or $-C_mH_{2m-t}X_t-$, wherein X is F, Cl, Br, or I, m is an integer in the range of 1 to 20, and t is an integer in the range of 0 to 40, provided that m is less than or equal to 2t. Haloalkyl groups that are not perhaloalkyl groups can be optionally substituted as disclosed herein.

As used herein, "arylalkyl" refers to an -alkyl-aryl group, wherein the arylalkyl group is covalently linked to the defined chemical structure via the alkyl group. An arylalkyl group is within the definition of an —Y—$C_{6-14}$ aryl group, where Y is as defined herein. An example of an arylalkyl group is a benzyl group (—$CH_2$—$C_6H_5$). An arylalkyl group can be optionally substituted, i.e., the aryl group and/or the alkyl group can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 20 carbon atoms, i.e., a $C_{2-20}$ alkenyl group. In some embodiments, alkenyl groups can be substituted as disclosed herein. An alkenyl group is generally not substituted with another alkenyl group or an alkyl or alkynyl group.

As used herein, "alkynyl" refers to a straight-chain or branched alkyl group having one or more triple carbon-carbon bonds. Examples of alkynyl groups include ethynyl, propynyl, butynyl, pentynyl, and the like. The one or more triple carbon-carbon bonds can be internal (such as in 2-butyne) or terminal (such as in 1-butyne). In various embodiments, an alkynyl group can have 2 to 20 carbon atoms, i.e., a $C_{2-20}$ alkynyl group. In some embodiments, alkynyl groups can be substituted as disclosed herein. An alkynyl group is generally not substituted with another alkynyl group or an alkyl or alkenyl group.

As used herein, "cycloalkyl" refers to a non-aromatic carbocyclic group including cyclized alkyl, alkenyl, and alkynyl groups. A cycloalkyl group can be monocyclic (e.g., cyclohexyl) or polycyclic (e.g., containing fused, bridged, and/or spiro ring systems), wherein the carbon atoms are located inside or outside of the ring system. Any suitable ring position of the cycloalkyl group can be covalently linked to the defined chemical structure. Examples of cycloalkyl groups include cyclopropyl, cyclopropylmethyl, cyclobutyl, cyclopentyl, cyclohexyl, cyclohexylmethyl, cyclohexylethyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as disclosed herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, N and S, and optionally contains one or more double or triple bonds. One or more N or S atoms in a cycloheteroalkyl ring can be oxidized (e.g., morpholine N-oxide, thiomorpholine S-oxide, thiomorpholine S,S-dioxide). In some embodiments, nitrogen atoms of cycloheteroalkyl groups can bear a substituent, for example, a hydrogen atom, an alkyl group, or other substituents as described herein. Cycloheteroalkyl groups can also contain one or more oxo groups, such as piperidone, oxazolidinone, pyrimidine-2,4(1H,3H)-dione, pyridin-2(1H)-one, and the like. Examples of cycloheteroalkyl groups include, among others, morpholine, thiomorpholine, pyran, imidazolidine, imidazoline, oxazolidine, pyrazolidine, pyrazoline, pyrrolidine, pyrroline, tetrahydrofuran, tetrahydrothiophene, piperidine, piperazine, and the like. In some embodiments, cycloheteroalkyl groups can be substituted as disclosed herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 30 carbon atoms in its ring system, which can include multiple fused rings. In some embodiments, a polycyclic aryl group can have from 8 to 14 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as disclosed herein. In some embodiments, an aryl group can have one or more halogen substituents, and can be referred to as a "haloaryl" group. Perhaloaryl groups, i.e., aryl groups wherein all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least 1 ring heteroatom selected from oxygen (O), nitrogen (N), sulfur (S), selenium (Se) and arsenic (As) or a polycyclic ring system where at least one of the rings present in the ring system is aromatic and contains at least 1 ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, from 5 to 14 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5-membered monocyclic and 5-6 bicyclic ring systems shown below:

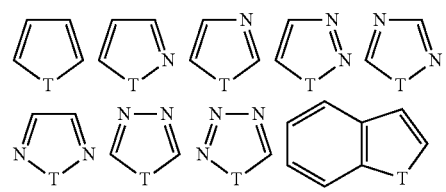

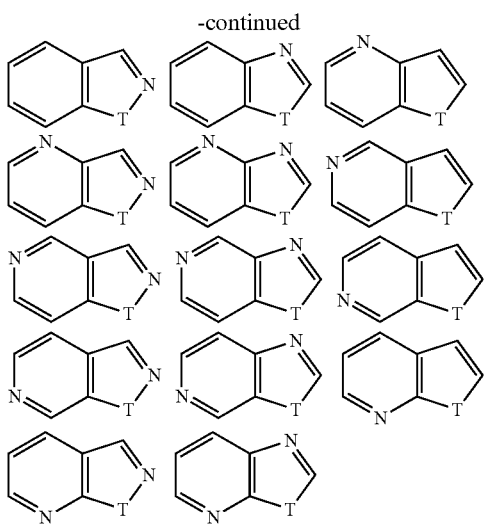

where T is O, S, NH, N-alkyl, N-aryl, or N-(arylalkyl) (e.g., N-benzyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as disclosed herein.

As used herein, "solubilizing group" refers to a functional group that makes the resultant molecule more soluble in most common organic solvents than a hydrogen atom would if it occupied the same position in a molecule (for the same molecule-solvent combinations). Examples of solubilizing groups include, but are not limited to alkyl (eg. methyl, ethyl, i-propyl, n-propyl, i-butyl, s-butyl, n-butyl, hexyl, 2-methyl hexyl, octyl, 3,7-dimethyl octyl, decyl, dodecyl, tetradecyl, hexadecyl), alkoxy (eg. methoxy, ethoxy, i-propoxy, n-propoxy, i-butyloxy, s-butyloxy, n-butyloxy, hexyloxy, 2-methyl hexyloxy, octyloxy, 3,7-dimethyl octyloxy, decyloxy, dodecyloxy, tetradecyloxy, hexadecyloxy), thioalkyl (e.g thiooctyl), alkylethers, thioethers.

The electron-donating or electron-withdrawing properties of several hundred of the most common substituents, reflecting all common classes of substituents have been determined, quantified, and published. The most common quantification of electron-donating and electronwithdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electronacceptor" refers to a functional group that draws electrons to itself more than a hydrogen atom would if it occupied the same position in a molecule. Examples of electron withdrawing groups include, but are not limited to, halogen or halo (e.g., F, Cl, Br, I), —$NO_2$, —CN, —NC, —$S(R^O)_2{}^+$, —$N(R^O)_3{}^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, —$CON(R^O)_2$, $C_{1-40}$ haloalkyl groups, $C_{6-14}$ aryl groups, and 5-14 membered electron-poor heteroaryl groups; where $R^O$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electronwithdrawing groups such as F, Cl, Br, —$NO_2$, —CN, —NC, —$S(R^O)_2{}^+$, —$N(R^O)_3{}^+$, —$SO_3H$, —$SO_2R^O$, —$SO_3R^O$, —$SO_2NHR^O$, —$SO_2N(R^O)_2$, —COOH, —$COR^O$, —$COOR^O$, —$CONHR^O$, —$CON(R^O)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^O$, —$NH_2$, —$NHR^O$, —$N(R^O)_2$, and 5-14 membered electron-rich heteroaryl groups, where $R^O$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

As used herein, "semicrystalline polymer" refers to a polymer that has an inherent tendency to crystallize at least partially either when cooled from the melt or deposited from solution, when subjected to kinetically favorable conditions such as slow cooling, or low solvent evaporation rate etc. The crystallization or lack thereof can be readily identified by an expert in the field-of-art by using several analytical methods, for eg. differential scanning calorimetry (DSC) and/or X-ray diffraction (XRD).

As used herein, "annealing" refers to a post-deposition heat treatment in to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing results in an increase of crystallinity in the polymer film where possible, thereby increasing field effect mobility. The increase in crystallinity can be monitored by several methods, for eg. by comparing the differential scanning calorimetry (DSC) or X-ray diffraction (XRD) measurements of the as-deposited and the annealed films.

Throughout the specification, structures may or may not be presented with chemical names. Where any question arises as to nomenclature, the structure prevails.

To aid solubility and without causing disruption of the intrachain π-conjugation and interchain stacking, alkyl chains (and similar groups such as haloalkyl groups, arylalkyl groups, heteroarylalkyl groups and so forth) can be substituted symmetrically on one or both positions of the thiophene rings and/or on the vinyl linkage. Accordingly, in certain embodiments, $R^1$, $R^2$, $R^3$ and $R^4$ can independently be a linear or branched $C_{1-20}$ alkyl group or a linear or branched $C_{2-20}$ alkenyl group. For example, $R^1$, $R^2$, $R^3$, $R^4$ at each occurrence independently can be selected from n-hexyl, n-octyl, n-decyl, n-dodecyl, n-tetradecyl and n-hexadecyl. In certain embodiments, at least one of $R^1$ and $R^2$ are H.

In some embodiments, W is independently a planar and highly conjugated cyclic core, wherein the ring atoms are covalently bonded with alternating single and double bonds. The highly conjugated and planar nature of such cores can promote π-electron delocalization (thereby increasing stability and lowering LUMO energy), and provide good intermolecular π-stacking. Examples of suitable cyclic cores include benzene, naphthalene, anthracene, tetracene, pentacene, perylene, pyrene, coronene, fluorene, indacene, indenofluorene, and tetraphenylene, as well as their analogs in which one or more carbon atoms are replaced with a heteroatom such as O, S, Si, Se, N or P.

In some embodiments, W is an optionally substituted monocyclic, bicyclic or heterocyclic moiety selected from

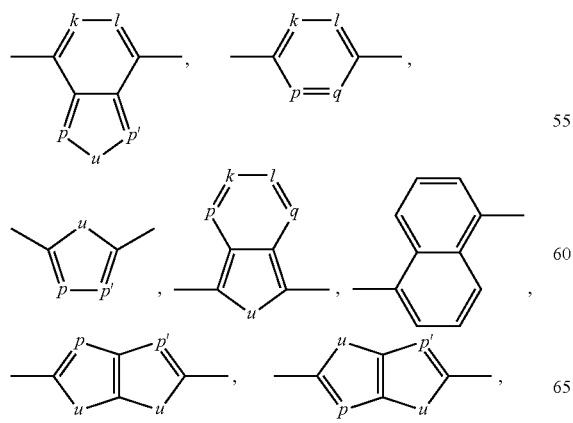

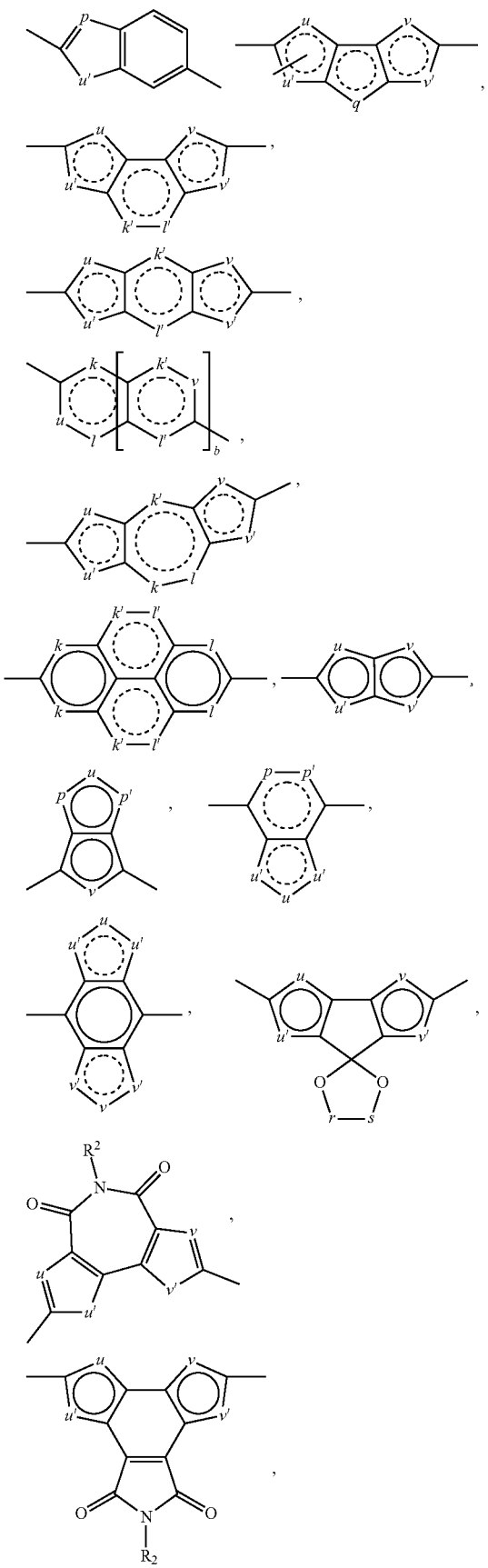

-continued

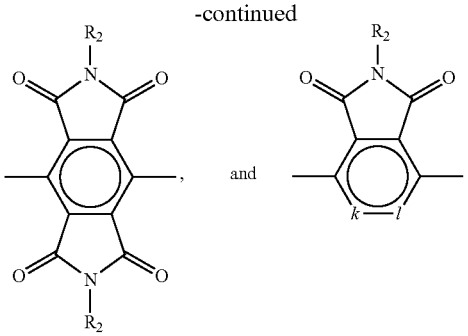
and wherein:
k, k', l, l', p, p', q, u, u', v and v' independently are selected from —S—, —O—, —CH=, =CH—, —CR$^{10}$=, =CR$^{10}$—, —C(O)—, —C(C(CN)$_2$)—, —N=, =N—, —NH—, —NR$^{10}$—, —SiR$^{11}$=, =SiR$^{11}$—, and —SiR$^{11}$R$^{11}$—;

R$^{10}$, at each occurrence, is independently selected from a) halogen, b) —CN, c) —NO$_2$, d) N(R$^c$)$_2$, e) —OR$^c$, f) —C(O)R$^c$, g) —C(O)OR$^c$, h) —C(O)N(R$^c$)$_2$, i) a C$_{1-40}$ alkyl group, j) a C$_{2-40}$ alkenyl group, k) a C$_{2-40}$ alkynyl group, l) a C$_{1-40}$ alkoxy group, m) a C$_{1-40}$ alkylthio group, n) a C$_{1-40}$ haloalkyl group, o) a —Y—C$_{3-14}$ cycloalkyl group, p) a —Y—C$_{6-14}$ aryl group, q) a —Y-3-14 membered cycloheteroalkyl group, and r) a —Y-5-14 membered heteroaryl group, wherein each of the C$_{1-40}$ alkyl group, the C$_{2-40}$ alkenyl group, the C$_{2-40}$ alkynyl group, the C$_{3-14}$ cycloalkyl group, the C6-14 aryl group, and the 3-14 membered cycloheteroalkyl group and Y and R$^c$ are as defined herein.

R$^{11}$, at each occurrence, independently can be H or R$^c$, wherein R$^c$ is as defined herein;

r and s independently can be —CR$^{11}$R$^{11}$— or —C(C(CN)$_2$)—; and b is 1, 2, 3 or 4.

In certain embodiments W is a monocyclic, bicyclic or heterocyclic moiety including one or more thienyl, thiazolyl, or phenyl groups, where each of these groups can be optionally substituted as disclosed herein. For example, W can be selected from

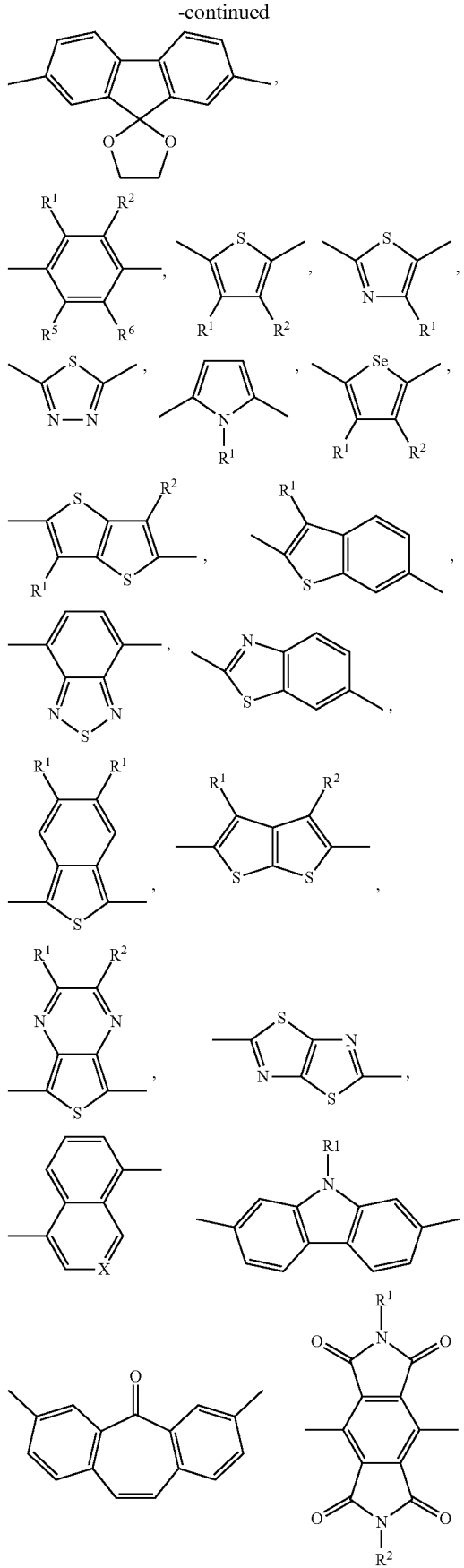

-continued

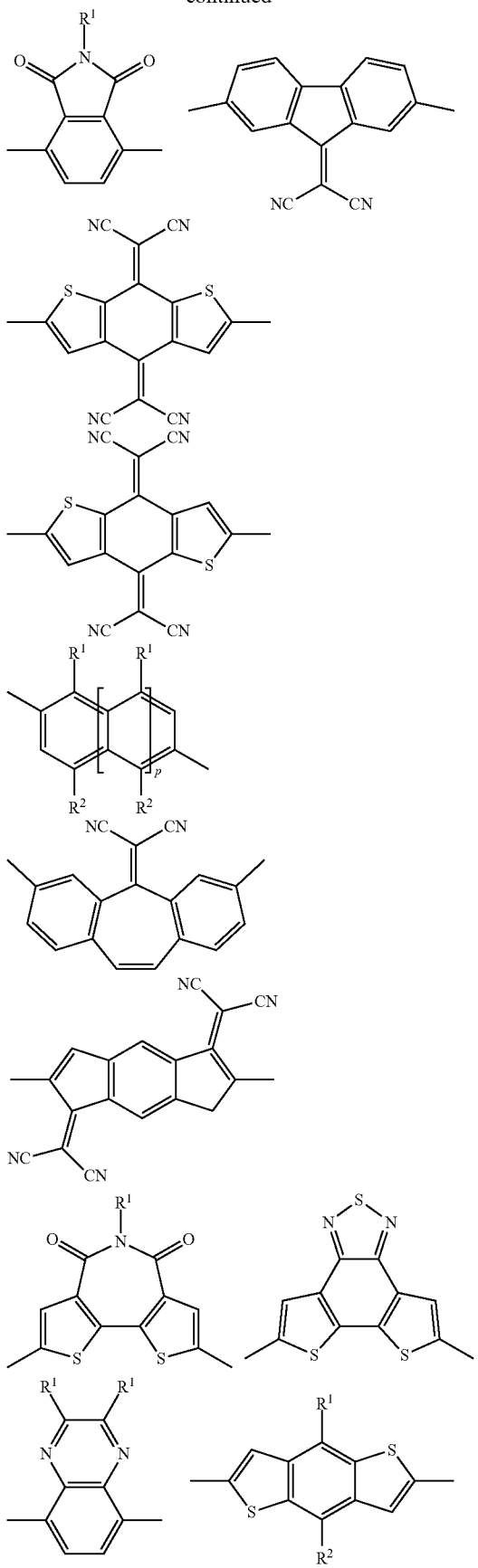

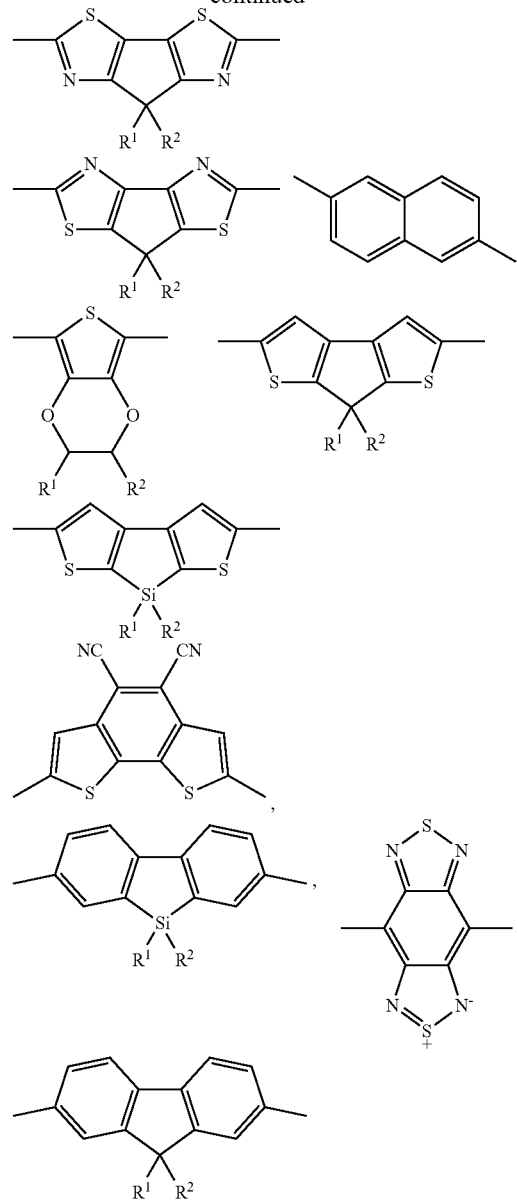

wherein $R^1$, $R^2$, $R^5$ and $R^6$ are at each occurrence independently from each other and as defined herein.

For the various polymers described above, n can be an integer between 2 and 5000. In some embodiments, n can be 18-5000. For example, n can be 8-4000, 8-2000, 8-500, or 8-200. In certain embodiments, n can be 8-100.

Accordingly, in certain embodiments, the polymers of the present invention include repeating units of Formula Ia

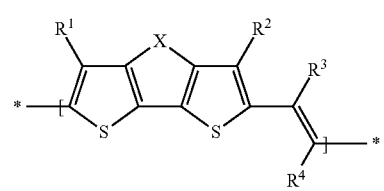

wherein X, $R^1$, $R^2$, $R^3$ and $R^4$ are defined as herein.

For example, in certain embodiments, polymers of the present invention can include repeating units of one or more of Formulae Ib, Ic, Id, Ie, If, Ig, Ih, Ii, Ij, Ik, Il and Im:

Ib
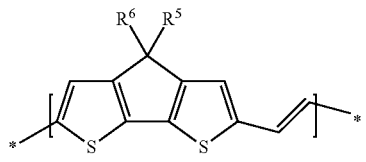

Ic
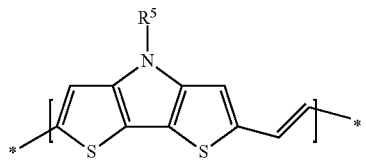

Id
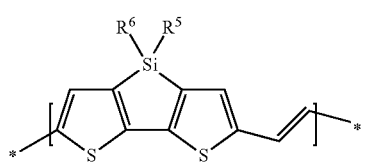

Ie
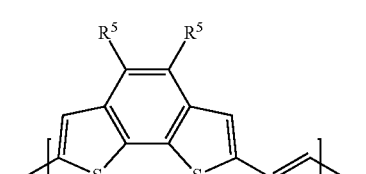

If
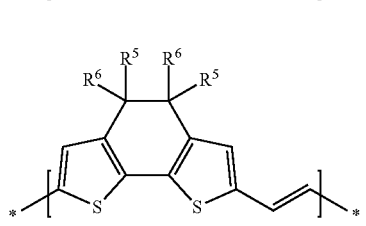

Ig
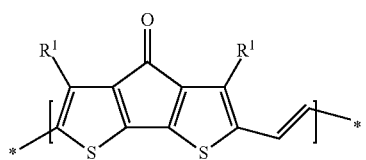

Ih
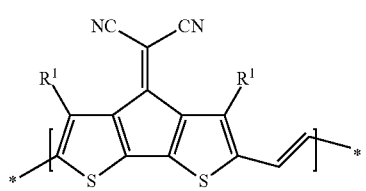

Ii
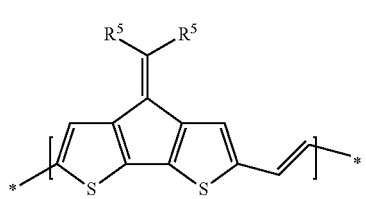

-continued

Ij
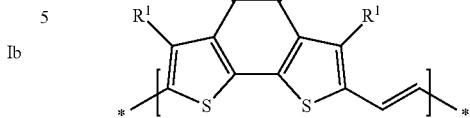

Ik
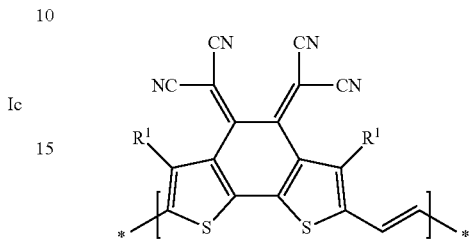

Il
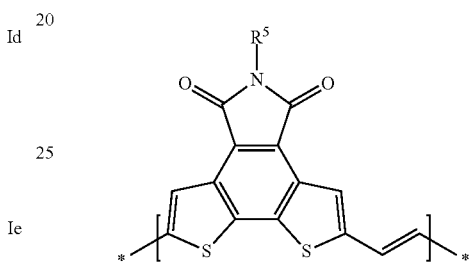

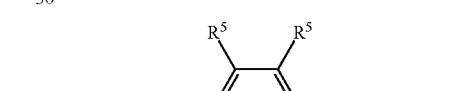

Im
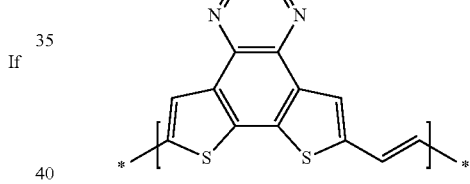

As further examples, certain embodiments of the polymers of the present invention can include repeating units of one or more of Formulae Ik, Il, Im, In, Io, Ip, Iq, Ir, Is and It:

In
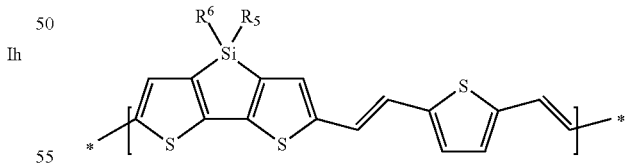

Io
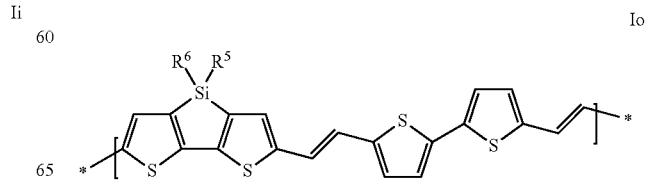

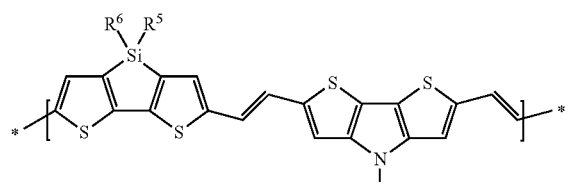

Ip

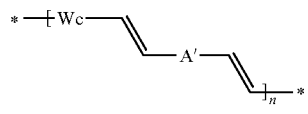

P1 wherein

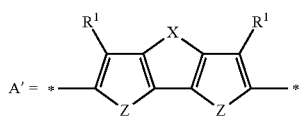

TOP = Tris(o-tolyl)phosphine,
TEA = Triethylamine.

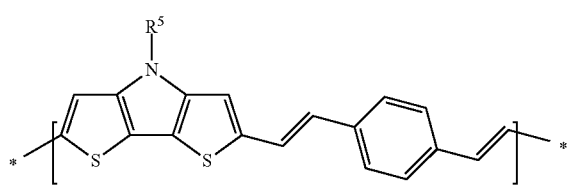

Iq

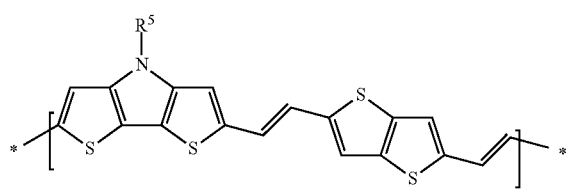

Ir

The dialdehyde 2 can be prepared from fused bithiophene compound 1 by treating with n-BuLi in the presence of dimethylformamide. Compound 3 can be synthesized by the well known Wittig reaction between the dialdehyde 2 and the methyltriphenylphosphonium iodide in the presence of n-butyllithium as a base. The copolymer P1 can be synthesized via Heck coupling reaction between the dibromo compound 4 and the divinyl compound 3. Endcapping of the polymer chains can be done by addition of 1-10% monobromo or mono vinyl aromatic or heteroaromatic units before workup of the polymerization mixture is worked up.

For example copolymer P2 can be synthesized following the scheme:

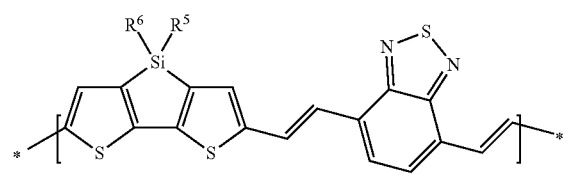

Is

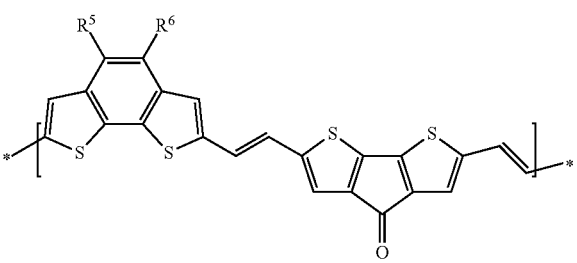

It

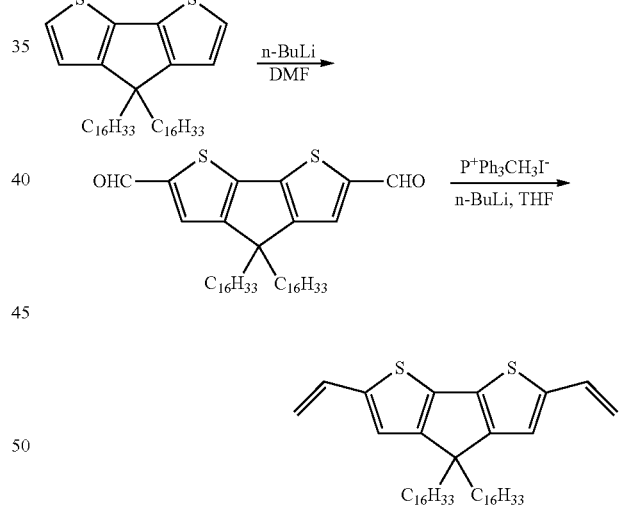

In some preferred embodiments of polymers Ia to It, $R^4$, $R^5$ are independently selected from H, CN, a $C_{1-30}$ alkyl group, a $C_{2-30}$ alkenyl group, and a $C_{1-30}$ haloalkyl group.

Copolymers can be prepared in accordance with the procedures outlined in Scheme 1 below:

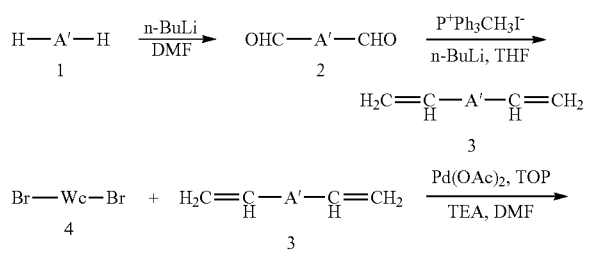

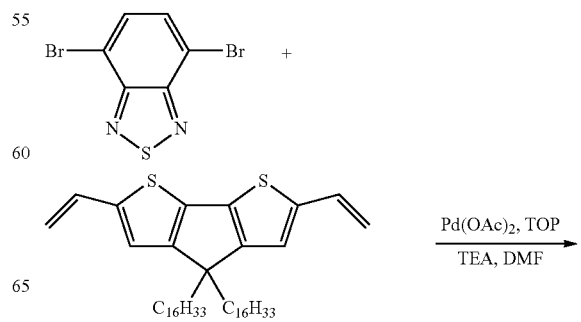

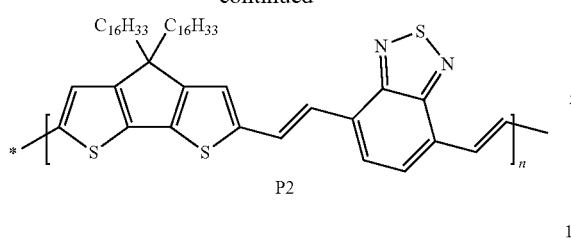

P2

Scheme 2 below shows an alternative synthesis for preparing certain embodiments of the present polymers:

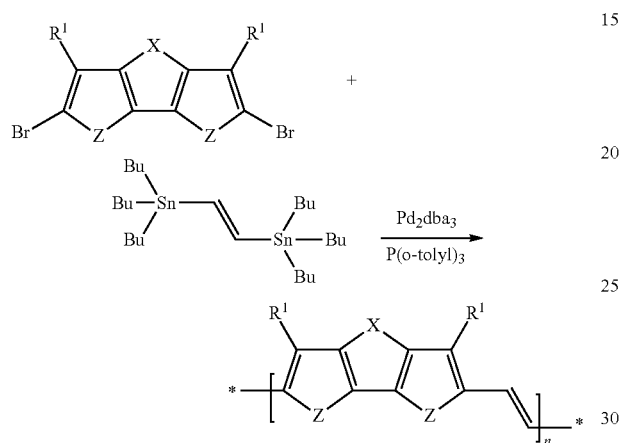

Pd$_2$dba$_3$ = Tris(dibenzylideneacetone)dipalladium(0)
P(o-tolyl)$_3$ = Tris-o-tolylphosphine
Bu = Butyl Scheme 3 below shows a method for preparing random copolymers of the invention:

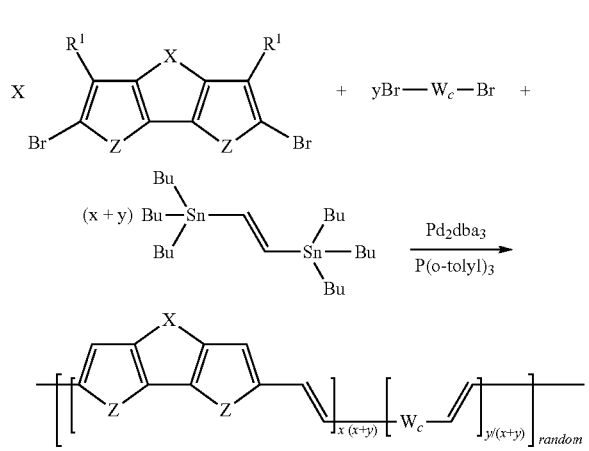

Scheme 4 below shows a synthesis for a specific embodiment of the polymers of the invention:

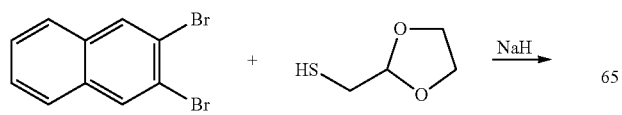

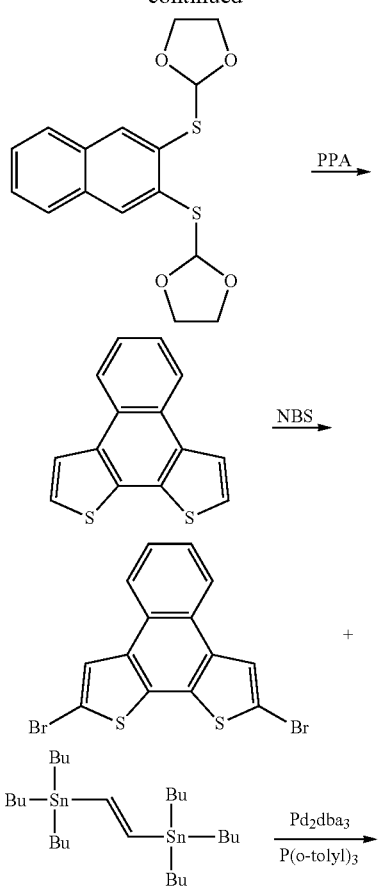

Scheme 5 below shows a synthesis for a further specific embodiment of the polymers of the invention:

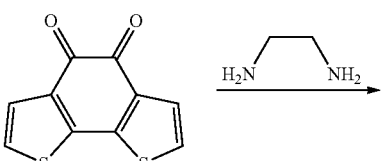

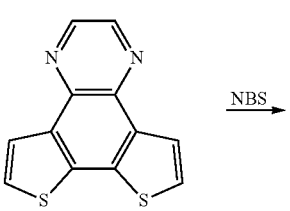

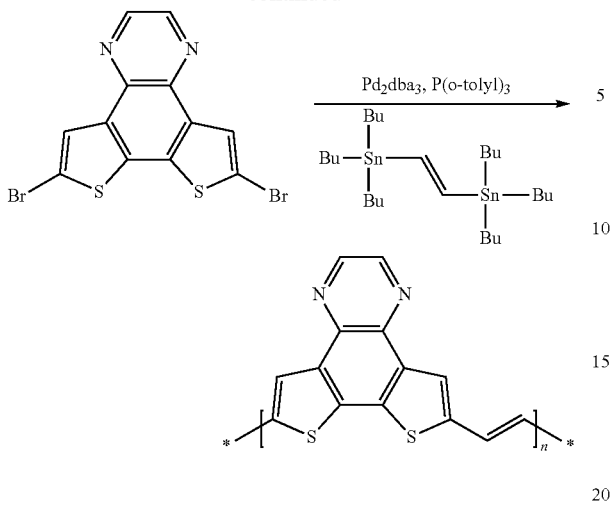

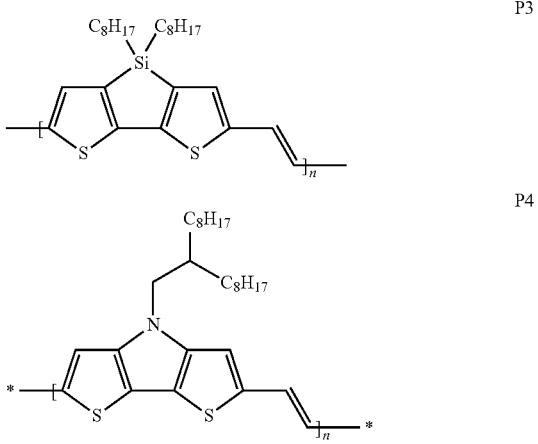

Exemplary polymers from the present invention include:

Other polymers of the present invention can be prepared in accordance with the procedures analogous to those described in Schemes 1, 2 and 3. Alternatively, the present polymers can be prepared from commercially available starting materials, compounds known in the literature, or readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

The molecular weights of the polymers of the present invention can be determined using size exclusion chromatography (SEC). In an embodiment of polymer P3 its molecular weight ($M_n$) was determined by SEC to be $1.43 \times 10^4$ g/mol. Its polydispersity index (PDI) was determined to be 2.7. For another embodiment of polymer P4 its molecular weight ($M_n$) was determined by SEC to be $6.8 \times 10^3$ g/mol (THF soluble). Its polydispersity index (PDI) was determined to be 1.7

The polymers of the invention can be used to prepare semiconductor materials (e.g., compositions and composites), which in turn can be used to fabricate various articles of manufacture, structures and devices. In some embodiments, semiconductor materials incorporating one or more polymers of the present teachings can exhibit n-type semiconducting activity and in some embodiments, semiconductor materials incorporating one or more polymers of the present teachings can exhibit p-type or ambipolar semiconducting activity.

The invention provides for electronic devices, optical devices, and optoelectronic devices comprising one or more polymers of the invention. In some embodiments, the invention provides for a thin film semiconductor comprising one or more polymers of the invention and a field effect transistor device comprising the thin film semiconductor. In particular, the field effect transistor device has a structure selected from top-gate bottom-contact structure, bottom-gate top-contact structure, top-gate top-contact structure, and bottom-gate bottom-contact structure. In certain embodiments, the field effect transistor device comprises a dielectric material, wherein the dielectric material comprises an organic dielectric material, an inorganic dielectric material, or a hybrid organic/inorganic dielectric material. In other embodiments, the invention provides for photovoltaic devices and organic light emitting devices comprising the thin film semiconductor comprising one or more polymers of the invention.

Given their relatively high solubilities in common solvents, the compounds of the present invention can offer processing advantages when used to fabricate electrical devices such as thin film semiconductors, field-effect devices, organic light emitting diodes (OLEDs), organic photovoltaics, photodetectors, capacitors, and sensors. As used herein, a compound can be considered soluble in a solvent when at least 0.1 mg of the compound is soluble in 1 mL of the solvent. Examples of common organic solvents include petroleum ethers; acetonitrile; aromatic hydrocarbons such as benzene, toluene, xylene, and mesitylene; ketones, such as acetone, and methyl ethyl ketone; ethers, such as tetrahydrofuran, dioxane, bis(2-methoxyethyl) ether, diethyl ether, diisopropyl ether, and t-butyl methyl ether; alcohols, such as methanol, ethanol, butanol, and isopropyl alcohol; aliphatic hydrocarbons, such as hexanes; acetates, such as methyl acetate, ethyl acetate, methyl formate, ethyl formate, isopropyl acetate, and butyl acetate; halogenated aliphatic and aromatic hydrocarbons, such as dichloromethane, chloroform, ethylene chloride, chlorobenzene, dichlorobenzene, and trichlorobenzene; and cyclic solvents such as cyclopentanone, cyclohexanone, and 2-methypyrrolidone.

Accordingly, the present invention also provides for compositions comprising one or more polymers of the invention dissolved or dispersed in a liquid medium. The liquid medium comprises water and/or an organic solvent and optionally one or more additives independently selected from viscosity modulators, detergents, dispersants, binding agents, compatibilizing agents, curing agents, initiators, humectants, antifoaming agents, wetting agents, pH modifiers, biocides, and bactereriostats.

Various deposition techniques, including various solution-processing techniques, have been used with organic electronics. For example, much of the printed electronics technology has focused on inkjet printing, primarily because this technique offers greater control over feature position and multi-layer registration. Inkjet printing is a noncontact process, which offers the benefits of not requiring a preformed master (compared to contact printing techniques), as well as digital control of ink ejection, thereby providing drop-on-demand printing. However, contact printing techniques have the key advantage of being well-suited for very fast roll-to-roll processing. Exemplary contact printing techniques include screen-printing, gravure, offset, flexo, and microcontact printing. Other solution processing techniques include, for example, spin coating, drop-casting, zone casting, dip coating, and blade coating.

The present polymers can exhibit versatility in their processing. Formulations including the present polymers can be printable via different types of printing techniques including gravure printing, flexographic printing, and inkjet printing, providing smooth and uniform films that allow, for example, the formation of a pinhole-free dielectric film thereon, and consequently, the fabrication of all-printed devices.

The present invention, therefore, further provides methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In some embodiments, the depositing step can be carried out by printing, including inkjet printing and various contact printing techniques (e.g., screen-printing, gravure, offset, pad, and microcontact printing). In other embodiments, the depositing step can be carried out by vacuum vapor deposition, spin coating, drop-casting, zone casting, dip coating, blade coating, or spraying.

The present invention further provides articles of manufacture, for example, composites that include a semiconductor material of the present teachings and a substrate component and/or a dielectric component. The substrate component can be selected from materials including doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., the crosslinked polymer blends described in U.S. patent application Ser. Nos. 11/315,076, 60/816,952, and 60/861,308, the entire disclosure of each of which is incorporated by reference herein) and a self-assembled superlattice/self-assembled nanodielectric (SAS/SAND) material (described in Yoon, M-H. et al., *PNAS*, 102 (13): 4678-4682 (2005), the entire disclosure of which is incorporated by reference herein), as well as a hybrid organic/inorganic dielectric material (described in U.S. patent application Ser. No. 11/642,504, the entire disclosure of which is incorporated by reference herein). The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene) poly(styrenesulfonate) (PEDOT:PSS), polyaniline (PANI), polypyrrole (PPy)). One or more of the composites described herein can be embodied within various organic electronic, optical, and opto-electronic devices such as organic thin film transistors (OTFTs), specifically, organic field effect transistors (OFETs), as well as sensors, solar cells, capacitors, complementary circuits (e.g., inverter circuits), and the like.

Figure 2:
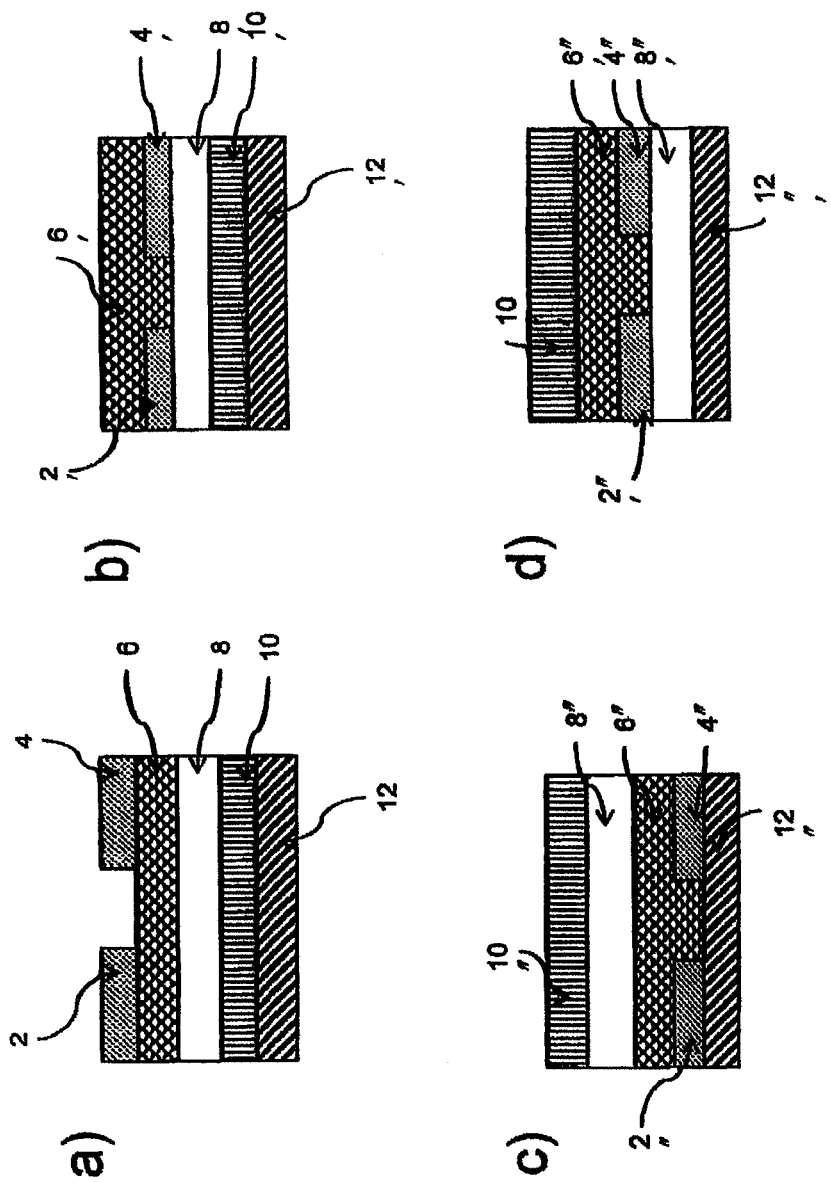
FIG. 2 illustrates four different configurations of thin film transistors: a) bottom-gate top contact, b) bottom-gate bottom-contact, c) top-gate bottom-contact, and d) top-gate top contact; each of which can be used to incorporate polymers of the present teachings.
Figure 3:
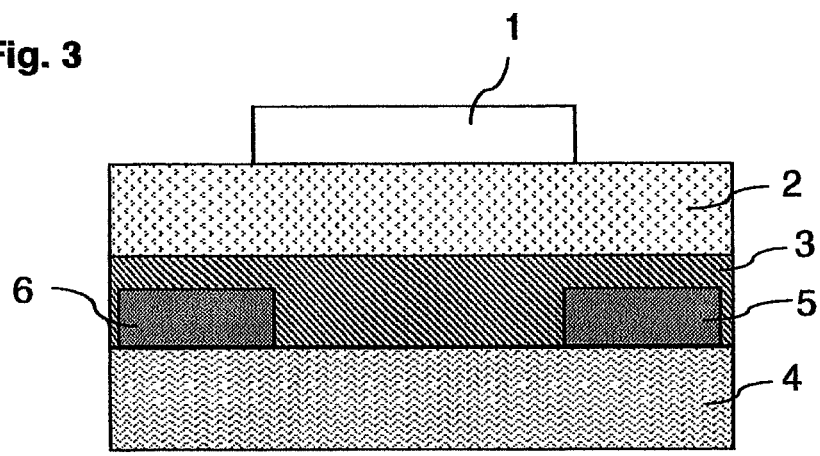
FIG. 3 shows the transistor structure used in Example 2F comprising a gate contact 1, a dielectric layer 2, a polymeric semiconductor layer 3, a substrate 4, a drain contact 5 and a source contact 6.
Figure 4:
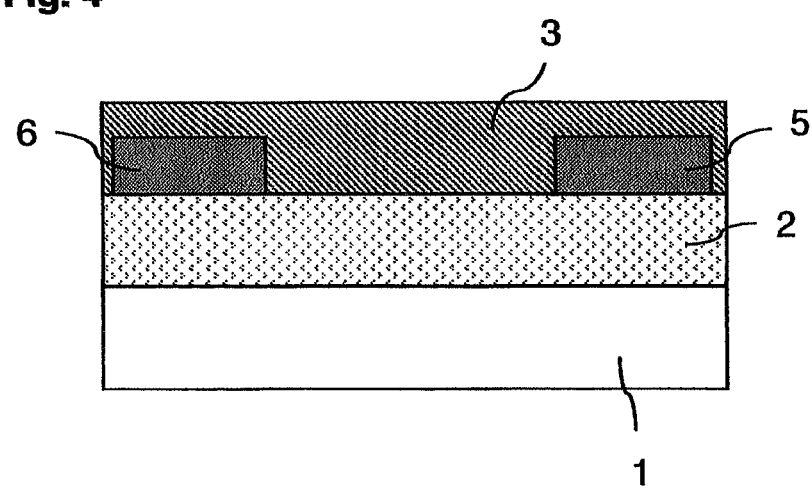
FIG. 4 shows the transistor structure used in Examples 2A-2E comprising a gate contact 1, a dielectric layer 2, a polymeric semiconductor layer 3, a drain contact 5 and a source contact 6.
Figure 5:
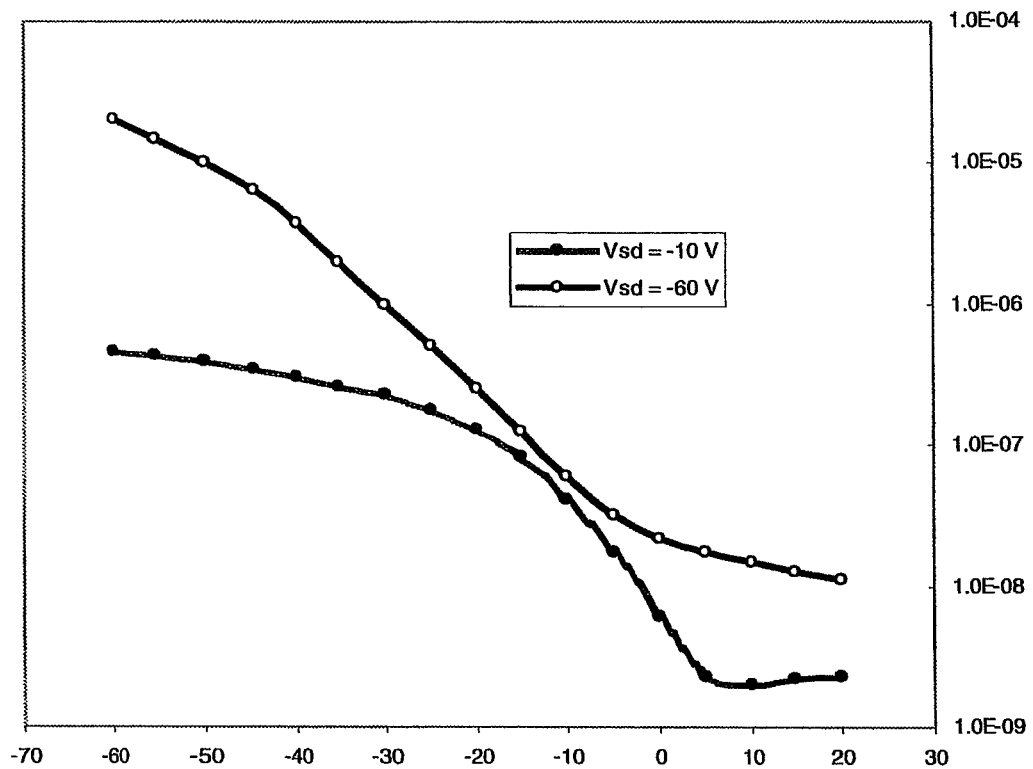
FIG. 5 shows an exemplary transfer plot for poply (dithienosilole-vinylene) based transistors having bottom gates bottom contact (BGBC) architecture, where the active layer was annealed at 200° C. Source Drain Current in Amps (ordinate) is plotted versus Gate Voltage in V (abscissa).
Figure 6:
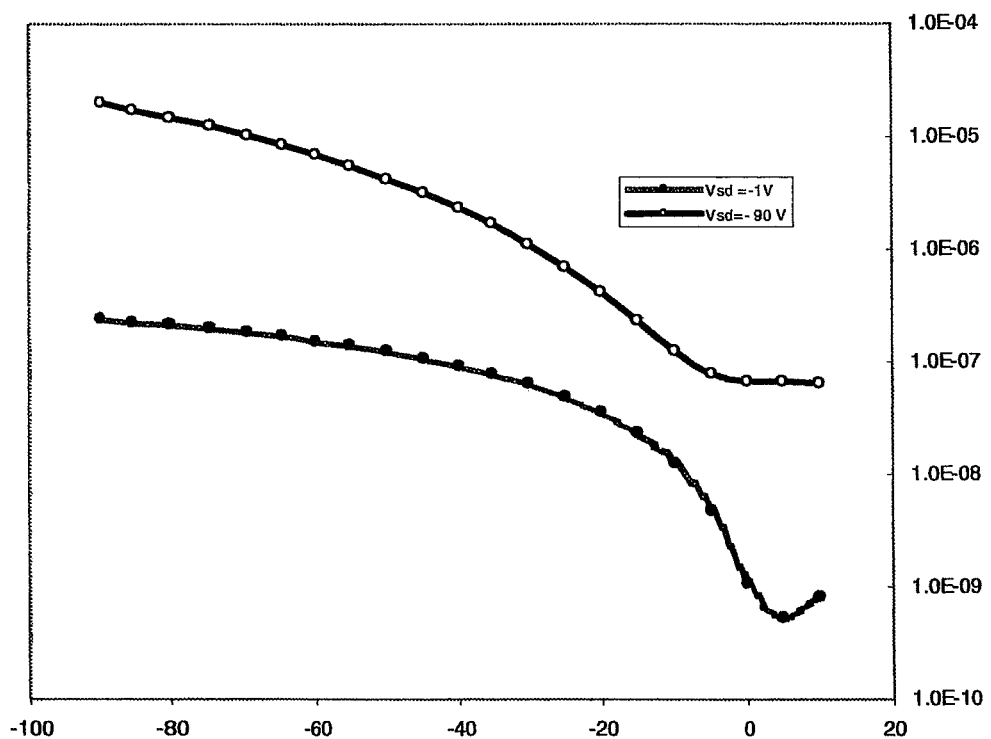
FIG. 6 shows an exemplary transfer plot for poly (dithienopyrrole-vinylene) based transistors having bottom gates bottom contact (BGBC), where the active layer was annealed at 125° C. Source Drain Current in Amps (ordinate) is plotted versus Gate Voltage in V (abscissa).
Figure 7:
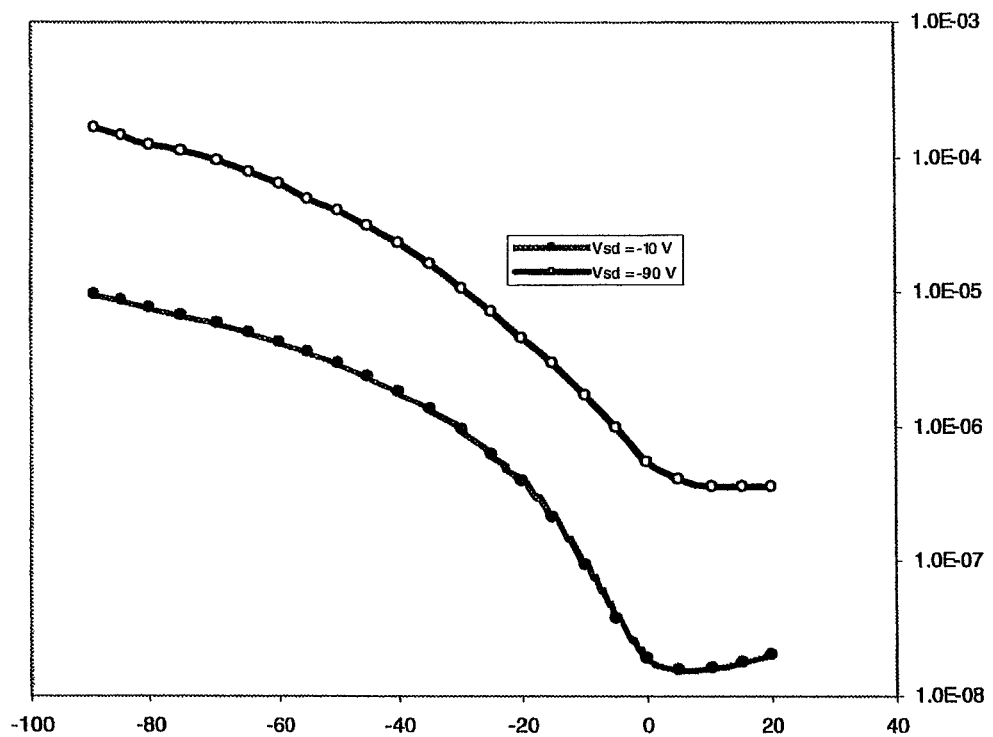
FIG. 7 shows an exemplary transfer plot for poly (dithienosilole-vinylene) based transistor having top gate bottom contact (TGBC) architecture, where the active layer was annealed at 230° C. Source Drain Current in Amps (ordinate) is plotted versus Gate Voltage in V (abscissa).

Accordingly, an aspect of the present invention relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottomgate bottom-contact capacitor structures. FIG. 2 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 2, an OFET can include a dielectric layer (e.g., shown as 8, 8', 8", and 8''' in FIGS. 2*a*, 2*b*, 2*c*, and 2*d*, respectively), a semiconductor layer (e.g., shown as 6, 6', 6", and 6''' in FIGS. 2*a*, 2*b*, 2*c*, and 2*d*, respectively), a gate contact (e.g., shown as 10, 10', 10", and 10''' in FIGS. 2*a*, 2*b*, 2*c*, and 2*d*, respectively), a substrate (e.g., shown as 12, 12', 12", and 12''' in FIGS. 2*a*, 2*b*, 2*c*, and 2*d*, respectively), and source and drain contacts (e.g., shown as 2, 2', 2", 2''', 4, 4', 4", and 4''' in FIGS. 2*a*, 2*b*, 2*c*, and 2*d*, respectively).

Another article of manufacture in which the polymers of the present teachings are useful is photovoltaics or solar cells. The polymers of the present teachings can exhibit broad optical absorption. Accordingly, the polymers described herein can be used as an n-type or p-type semiconductor in a photovoltaic design, which includes an adjacent p-type or n-type semiconducting material respectively to form a p-n junction. The polymers can be in the form of a thin film semiconductor, which can be a composite of the thin film semiconductor deposited on a substrate. Exploitation of the polymers of the present teachings in such devices is within the knowledge of the skilled artisan.

Accordingly, another aspect of the present invention relates to methods of fabricating an organic field effect transistor that incorporates a semiconductor material of the present teachings. The semiconductor materials of the present invention can be used to fabricate various types of organic field effect transistors including top-gate top-contact capacitor structures, top-gate bottom-contact capacitor structures, bottom-gate top-contact capacitor structures, and bottom-gate bottom-contact capacitor structures.

In certain embodiments, OTFT devices can be fabricated with the present compounds on doped silicon substrates, using $SiO_2$ as the dielectric, in top-contact geometries. In particular embodiments, the active semiconducting layer which incorporates at least a compound of the present teachings can be applied by spin-coating or jet printing. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

The following examples are provided to illustrate further and to facilitate the understanding of the present teachings and are not in any way intended to limit the invention.

EXAMPLE 1

Polymer Synthesis

The following examples describe the preparation of certain polymers of the present invention and related intermediates All reagents were purchased from commercial sources and used without further purification unless otherwise noted. Conventional Schlenk techniques were used, and reactions were carried out under $N_2$ unless otherwise noted. NMR spectra were recorded on a Varian 400MR spectrometer ($^1$H, 400 MHz). Polymer molecular weights were determined on Agilent 1200 series with refractive index detector in THF at room temperature versus polystyrene standards. The thermal characteristics of polymer were studied using a differential scanning calorimeter (DSC) (Mettler Toledo, DSC/823e/500/404) with a scanning rate of 10° C./min. Elemental analyses were performed at the National University of Singapore.

Example 1A

Preparation of poly(dithienosilole-vinylene) P3

Compound 1 was synthesized as reported in H. Usta et al., J. Am. Chem. Soc. 2006, 128, 9034-9035.

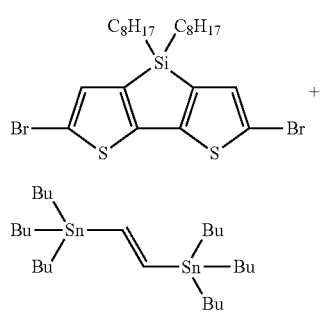

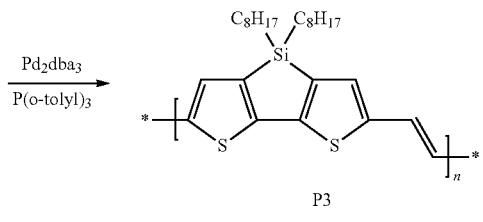

Synthesis of dithienosilole-vinyl polymers. $Pd_2dba_3$ (0.048 g, 0.052 mmol), and P(o-tolyl)$_3$ (0.032 g, 0.104 mmol) were added to a 100 mL RBF and degassed three times. After that, dibromodithienosilole 5 (1.00 g, 1.73 mmol), distannylvinylene 6 (1.05 g, 1.73 mmol), and chlorobenzene (58 mL) were added and the mixture was stirred at 130° C. for two days. 2-Bromothiophene and 2-tributylstannylthiophene were added as end cappers, with 2-bromothiophene added first followed by 2-tributylstannylthiophene after 2 h. After another 2 h stirring, the reaction mixture was cooled to room temperature. The reaction solution was then added dropwise to 700 mL methanol, filtered, and then subjected to Soxhlet extraction with acetone (24 h) and isopropyl acetate (24 h). The polymer P3 was recovered as solid mass. Elemental analysis (calcd): C, 70.10 (70.53); H, 7.90 (8.56).

Example 1B

Preparation of poly(dithienopyrrole-vinylene) P4

Compound 4 can be synthesized from literature reported compound 3 (Koeckelberghs, G. Tetrahedron 2005, 61, 687-691) as shown in the following Scheme.

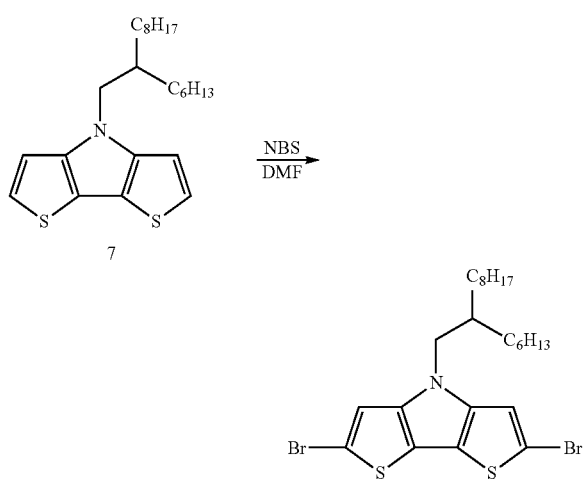

N-bromosuccinimide (1.20 g, 6.76 mmol) was dissolved in DMF (5 mL) and added dropwise at 0° C. to a stirred solution of dithienopyrrole 7 (1.24 g, 3.07 mmol) in DMF (10 mL). Then the reaction mixture was stirred for 1 h at room temperature. The reaction was quenched by addition of ice water. The product was extracted with diethyl ether. The combined organic fractions were washed with brine and dried over sodium sulfate. The solvent was removed under reduced pressure and the residue was purified by chromatography on silica gel with 0-1% ethyl acetate in hexane as eluent to give the greenish viscous oil 8. Isolated yield=(1.09 g, 63.2%).

$^1$H-NMR (400 MHz) ppm 6.90 (s, 2H) ppm 3.94 (d, 2H, J=7.4Hz) ppm 1.91 (m, 1H) ppm 1.25 (m, 24H) ppm 0.87 (m, 6H).

Compound 6 is commercially available.

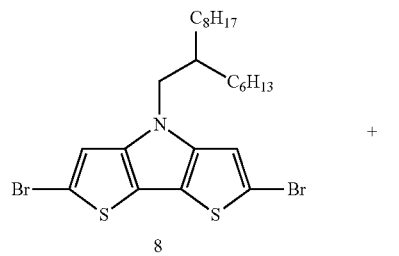

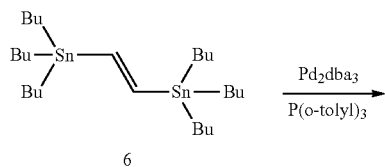

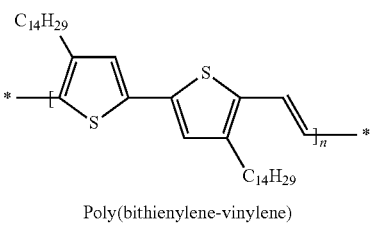

Poly(bithienylene-vinylene)

The UV-Vis. absorption spectra show that, by introducing the bridging group between two thiophenes either with silicon i.e polymer P3 or nitrogen i.e polymer P4, a red shift by about 75 nm in the absorption maximum of the new polymers compared to polymer P5 is observed. In films, this shift is expected to be even more pronounced leading to better harvesting of light for OPV applications due to better overlap with the solar spectrum. Surprisingly, the red shift in absorption maximum observed was independent of the nature of the bridging unit i.e with either an electropositive element (Si) or an electronegative element (N) as a bridging unit, both the resultant polymers P3 and P4 showed red shift of the absorption maximum and 0.1-0.2 eV reduction in the bandgaps as compared to P5.

EXAMPLE 3

Preparation of Random Copolymer P6

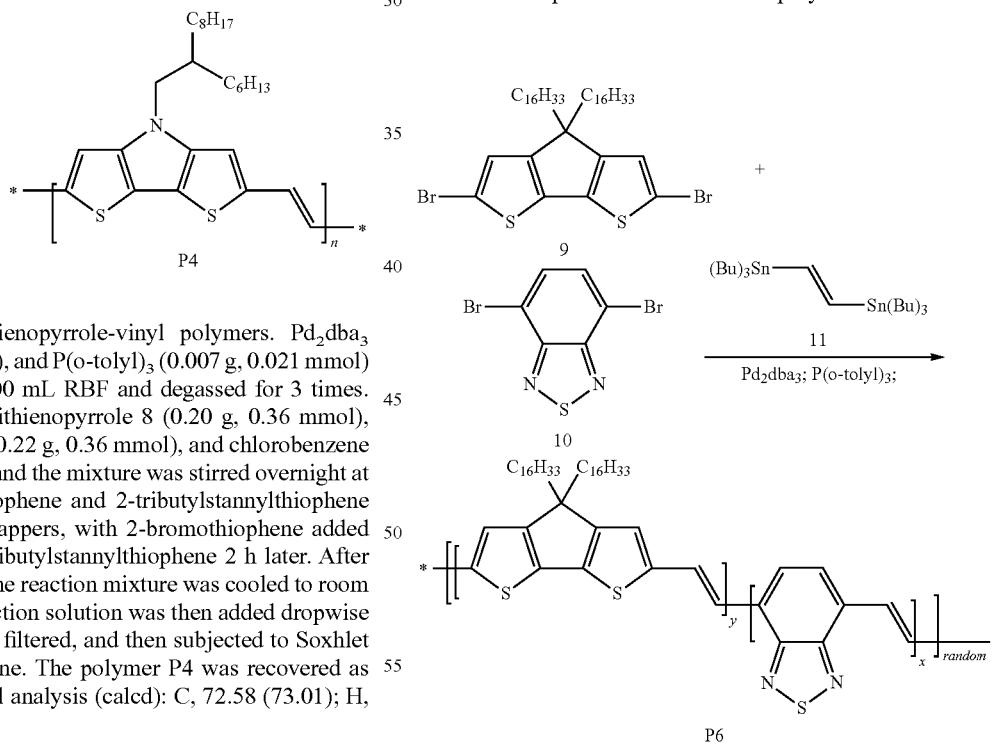

Synthesis of dithienopyrrole-vinyl polymers. Pd$_2$dba$_3$ (0.010 g, 0.011 mmol), and P(o-tolyl)$_3$ (0.007 g, 0.021 mmol) were added to the 100 mL RBF and degassed for 3 times. After that, dibromodithienopyrrole 8 (0.20 g, 0.36 mmol), distannylvinylene 6 (0.22 g, 0.36 mmol), and chlorobenzene (20 mL) were added and the mixture was stirred overnight at 130° C. 2-Bromothiophene and 2-tributylstannylthiophene were added as end cappers, with 2-bromothiophene added first followed by 2-tributylstannylthiophene 2 h later. After another 2 h stirring, the reaction mixture was cooled to room temperature. The reaction solution was then added dropwise to 400 mL methanol, filtered, and then subjected to Soxhlet extraction with acetone. The polymer P4 was recovered as solid mass. Elemental analysis (calcd): C, 72.58 (73.01); H, 7.94 (8.72).

EXAMPLE 2

UV-Vis Spectrum

FIG. 1 shows the UV-Vis spectrum of poly(dithienosilole-vinylene) P3, poly(dithienopyrrole) P4, and poly(bithiophene-vinylene) P5.

where y=0.5 and x=0.5

2,7-Dibromo-4,4-dihexadecylcyclopentadithiophene 9 (150 mg, 0.19 mmol), dibromobenzothiadiazole 10 (60 mg, 0.19 mmol), Pd$_2$dba$_3$ (10 mg, 0.03 eq.), and P(o-tolyl)$_3$ (7 mg, 0.06 eq.) were added to the rbf and degassed for three times. After that, (E)-1,2-bis-(tributylstannyl)ethane 11 (230 mg, 0.38 mmol), and chlorobenzene (19 mL) were added and the mixture was stirred at 130° C. for 48 h. 2-bromothiophene and 2-tributylstannylthiophene were added as end cappers. For work up, the polymer solution was precipitated in methanol followed by stirring for 2 h. Polymer was filtered and subjected to the Soxhlet extraction with acetone for 12 h. Furthermore, the solid was then dissolved in THF and reprecipitated from methanol, filtered and dried. Yield=83.92%. Mn=1.4×10⁴×10⁴ g/mol, PDI=4.6. Elemental analysis (calculated) C: 75.45% (75.50%), H: 9.10% (9.19%), N: 2.72% (3.45%).

EXAMPLE 4

Preparation of Random Copolymer P7

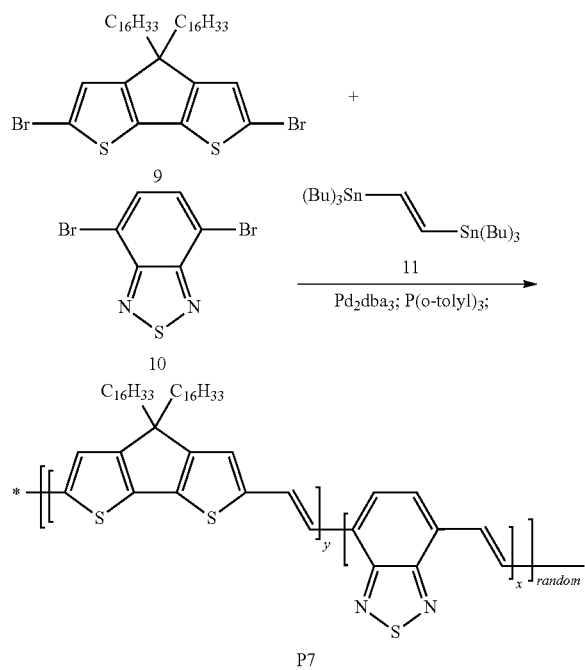

wherein y=0.7 and x=0.3

2,7-Dibromo-4,4-dihexadecylcyclopentadithiophene 9 (200 mg, 0.25 mmol), dibromobenzothiadiazole 10 (30 mg, 0.11 mmol), $Pd_2dba_3$ (10 mg, 0.03 eq.), and P(o-tolyl)$_3$ (7 mg, 0.06 eq.) were added to the rbf and degassed for three times. After that, (E)-1,2-bis-(tributylstannyl)ethane 11 (230 mg, 0.36 mmol), and chlorobenzene (18 mL) were added and the mixture was stirred at 130° C. for 48 h. 2-bromothiophene and 2-tributylstannylthiophene were added as end cappers. For work up, the polymer solution was precipitated in methanol followed by stirring for 2 h. Polymer was filtered and subjected to the Soxhlet extraction with acetone for 12 h. Furthermore, the solid was then dissolved in THF and reprecipitated from methanol, filtered and dried. Yield=78.1%. Mn=2.8×10⁴ g/mol, PDI=2.9. Elemental analysis (calculated) C: 76.19% (77.47%), H: 9.58 % (10.04%), N: 1.37 % (1.67%).

EXAMPLE 5

Device Fabrication

The semiconducting properties of polymers of the present teachings were evaluated in two transistor architectures (bottom-gate bottom-contact and top-gate bottom-contact). Bottom-gate bottom-contact (BGBC) thin film transistors (TFTs) were fabricated on n⁺⁺-Si substrates with a thermally grown $SiO_2$ (200 nm) layer, with photolithographically patterned Au S/D electrodes of different channel dimensions ranging from W=350 μm to 7 mm, and L=5 μm to 100 μm for a W/L of 70. These substrates were treated with hexamethyldisilazane vapor overnight before semiconductor deposition. All BGBC devices were completed with the semiconductor layer deposition by spin-coating (concentration ~5-10 mg/mL in DCB, 1000-2000 rpm, film dried in ambient at ~90° C. for 30 seconds or optionally annealed for 1 hour as shown in Table 1, film thickness=10-50 nm).

Top-gate bottom-contact (TGBC) TFTs were fabricated on glass (PGO glass) and were used as received. Au source-drain contacts (30 nm-thick) were thermally-evaporated. These substrates were coated with the semiconductor layer deposited by spin-coating (concentration ~5-10 mg/mL in CHCs mixture, 1500-2000 rpm, film dried at 90° C. for 30 seconds and were optionally annealed for 1 hour as shown in Table 1, film thickness=10-30 nm). A 20-60 mg/ml solution of Polystyrene in a proprietary formulation was spincoated (1500-2000 rpm) and the dielectric film was dried at 100° C. for 1 minute. The resulting dielectric thickness is 300-400 nm. The device structure was completed by vapor deposition of patterned Au gate contacts (~30 nm thick) through a shadow mask. Channel lengths and widths are 25-75 μm and 0.5-1.5 mm, respectively, to afford W/L=20.

All device fabrication processes, except the film annealing steps, were performed under ambient conditions.

A dual-channel Keithley 2612 or a Keithley 4200 semiconductor characterization system with 3 source measurement units (SMUs) configured with preamplifiers was used to perform all electrical characterizations of the fabricated transistors. The other major component of the test system is a Signatone probe station. A dark/metal box enclosure was used to avoid light exposure and to reduce environmental noise.

Transistor carrier mobilities (μ) were calculated by standard field effect transistor equations. In traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current, $V_{DS}$ is the potential between the source and drain, and $V_G$ is the gate voltage).

At large $V_{DS}$, the current saturates and is given by:

$$(I_{DS})_{sat}=(WC_i/2L)\mu(V_G-V_t)^2 \qquad (1)$$

where L and W are the device channel length and width, respectively, $C_i$ is the specific capacitance of the gate insulator, and $V_t$ is the threshold voltage. Mobilities (μ) were calculated in the saturation regime by rearranging equation (1):

$$\mu_{sat}=(2I_{DS}L)/[WC_i(V_G-V_t)^2] \qquad (2)$$

The threshold voltage ($V_t$) can be estimated as the x intercept of the linear section of the plot of $V_G$ versus $(I_{DS})^{1/2}$.

Table 1 summarizes the structure, the material for the different components, and the method of fabrication of the devices made from polymers P3 and P4.

TABLE 1

| S. No. | Device Configuration | Substrate | Polymer | Annealing Temperature | Dielectric | Mobility (cm²/Vs) |
|---|---|---|---|---|---|---|
| A | BGBC | Silicon | P3 | No annealing | $SiO_2$ | 3-7 × 10⁻⁴ |
| B | BGBC | Silicon | P3 | 150° C. | $SiO_2$ | 3-6 × 10⁻³ |
| C | BGBC | Silicon | P3 | 200° C. | $SiO_2$ | 0.8-3 × 10⁻² |

TABLE 1-continued

| S. No. | Device Configuration | Substrate | Polymer | Annealing Temperature | Dielectric | Mobility (cm²/Vs) |
|---|---|---|---|---|---|---|
| D | BGBC | Silicon | P4 | No annealing | SiO₂ | 1-3 × 10⁻² |
| E | BGBC | Silicon | P4 | 125° C. | SiO₂ | 0.4-1 × 10⁻¹ |
| F | TGBC | Glass | P3 | 230° C. | Polystyrene | 0.08-0.15 |

As a further example, photovoltaic devices can be made by blending polymer P3 or P4 with electron acceptors such as 1-(3-methoxycarbonyl)propyl-1-phenyl-[6,6]-$C_{61}$ (PCBM) or perylenediimide (PDI) derivatives and casting films from a common solvent onto a bottom substrate that can also act as one of the electrodes. The device is completed by deposition of the counter electrode on top. The ratio of the polymer to the electron acceptor can be carefully optimized by experiment. The film may be optionally annealed to achieve the right morphology. Other electron acceptors can also be used, and other architectures such as dye sensitized solar cell (DSSC) are also possible.

Table 2 summarizes the structure, the method of fabrication and the results obtained for devices made from polymers P6 and P7.

TABLE 2

| Polymer | Device configuration | Concentration | Annealing Temperature | Mobility (cm²/Vs) | On/Off ratio | $V_{on}$ |
|---|---|---|---|---|---|---|
| P6 | BGBC | 10 mg/ml DCB | 200° C. 30 min | 1.06 × 10⁻² | 2.27 × 10⁴ | 0 |
| P7 | BGBC | 10 mg/ml DCB | Room Temperature | 4.06 × 10⁻³ | 2.88 × 10³ | 20 |

The invention claimed is:

1. A polymer, comprising a repeating unit A and optionally a repeating unit B, corresponding to formulae

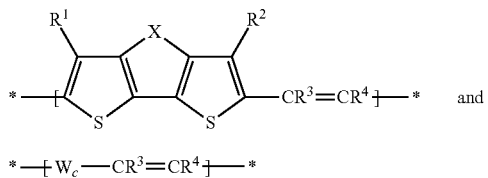

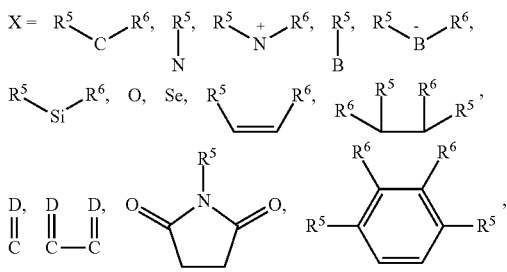

wherein

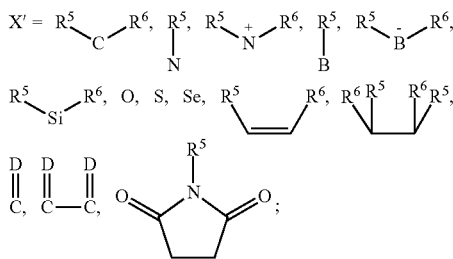

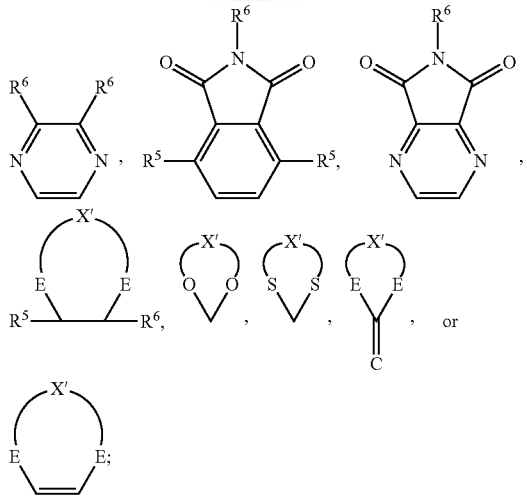

D=O, C(CN)₂, or CR⁴R⁵;
E=CR⁴R⁵, NR⁴, O, or S;

[additional X' structures shown]

W, at each occurrence, is independently a monocyclic or polycylic moiety optionally substituted with 1-4 $R^a$ groups;

$R^a$, at each occurrence, is independently a) a halogen, b) —CN, c) —NO₂, d) oxo, e) —OH, f) =C($R^b$)₂, g) a $C_{1-20}$ alkyl group, h) a $C_{2-20}$ alkenyl group, i) a $C_{2-20}$ alkynyl group, j) a $C_{1-20}$ alkoxy group, k) a $C_{1-20}$ alkylthio group, l) a $C_{1-20}$ haloalkyl group, m) a —Y—$C_{3-10}$ cycloalkyl group, n) a —Y—$C_{6-14}$ aryl group, o) a —Y-3-12 membered cycloheteroalkyl group, or p) a —Y-5-14 membered heteroaryl group, wherein each of the $C_{1-20}$ alkyl group, the $C_{2-20}$ alkenyl group, the $C_{2-20}$ alkynyl group, the $C_{3-10}$ cycloalkyl group, the $C_{6-14}$ aryl or haloaryl group, the 3-12 membered cycloheteroalkyl group, and the 5-14 membered heteroaryl group is optionally substituted with 1-4 $R^b$ groups;

$R^b$, at each occurrence, is independently a) a halogen, b) —CN, c) —NO₂, d) oxo, e) —OH, f) —NH₂, g) —NH($C_{1-20}$ alkyl), h) —N($C_{1-20}$ alkyl)₂, i) —N($C_{1-20}$ alkyl)—$C_{6-14}$ aryl, j) —N($C_{6-14}$ aryl)₂, k) —S(O)$_m$H, l) —S(O)$_m$—$C_{1-20}$ alkyl, m) —S(O)₂OH, n) —S(O)$_m$—OC$_{1-20}$ alkyl, o) —S(O)$_m$OC$_{6-14}$ aryl, p) —CHO, q) —C(O)—$C_{1-20}$ alkyl, r) —C(O)—$C_{6-14}$ aryl, s) —C(O)OH, t) —C(O)—OC$_{1-20}$ alkyl, u) —C(O)—OC$_{6-14}$ aryl, v) —C(O)NH₂, w) —C(O)NH—$C_{1-20}$ alkyl, x) —C(O)N($C_{1-20}$ alkyl)₂, y) —C(O)NH—$C_{6-14}$ aryl, z) —C(O)N($C_{1-20}$ alkyl)—$C_{6-14}$ aryl, aa) —C(O)N($C_{6-14}$ aryl)₂, ab) —C(S)NH₂, ac) —C(S)NH—$C_{1-20}$ alkyl, ad) —C(S)N($C_{1-20}$ alkyl)₂, ae) —C(S)N($C_{6-14}$ aryl)₂, af) —C(S)N($C_{1-20}$ alkyl)—$C_{6-14}$ aryl, ag) —C(S)NH—$C_{6-14}$ aryl, ah) —S(O)$_m$NH$_2$, ai) —S(O)$_m$NH(C$_{1-20}$ alkyl), aj) —S(O)$_m$N(C$_{1-20}$ alkyl)$_2$, ak) —S(O)$_m$NH(C$_{6-14}$ aryl), al) —S(O)$_m$N(C$_{1-20}$ alkyl)—C$_{6-14}$ aryl, am) —S(O)$_m$N(C$_{6-14}$ aryl)$_2$, an) SiH$_3$, ao) SiH(C$_{1-20}$ alkyl)$_2$, ap) SiH$_2$(C$_{1-20}$ alkyl), ar) —Si(C$_{1-20}$ alkyl)$_3$, as) a C$_{1-20}$ alkyl group, at) a C$_{2-20}$ alkenyl group, au) a C$_{2-20}$ alkynyl group, av) a C$_{1-20}$ alkoxy group, aw) a C$_{1-20}$ alkylthio group, ax) a C$_{1-20}$ haloalkyl group, ay) a C$_{3-10}$ cycloalkyl group, az) a C$_{6-14}$ aryl or haloaryl group, ba) a 3-12 membered cycloheteroalkyl group, or bb) a 5-14 membered heteroaryl group;

Y, at each occurrence, is independently a divalent C$_{1-6}$ alkyl group, a divalent C$_{1-6}$ haloalkyl group, or a covalent bond;

m, at each occurrence, is independently 0, 1 or 2;

R$^1$, R$^2$, R$^5$, R$^6$, at each occurrence, are independently H, CN, a C$_{1-30}$ alkyl group, a C$_{2-30}$ alkenyl group, a C$_{1-30}$ haloalkyl group, -L-Ar$^1$, -L-Ar$^1$—Ar$^1$, -L-Ar$^1$—R$^7$, or -L-Ar$^1$—Ar$^1$—R$^7$;

L, at each occurrence, is independently —O—, —Y—O—Y—, —S—, —S(O)—, —Y—S—Y—, —C(O)—, —NR$^c$C(O)—, —NR$^c$—, —SiR$^c{}_2$—, —Y—[SiR$^c{}_2$]—Y—, a divalent C$_{1-30}$ alkyl group, a divalent C$_{1-30}$ alkenyl group, a divalent C$_{1-30}$ haloalkyl group, or a covalent bond;

R$^c$, at each occurrence, is H, a C$_{1-20}$ alkyl group, or a —Y—C$_{6-14}$ aryl group;

Ar$^1$, at each occurrence, is independently a C$_{6-14}$ aryl group or a 5-14 membered heteroaryl group, each optionally substituted with 1 to 5 substituents selected from the group consisting of a halogen, —CN, a C$_{1-6}$ alkyl group, a C$_{1-6}$ alkoxy group, and a C$_{1-6}$ haloalkyl group; and R$^7$, at each occurrence, is independently a C$_{1-20}$ alkyl group, a C$_{2-20}$ alkenyl group, a C$_{1-20}$ haloalkyl group, a C$_{1-20}$ alkoxy group, -L'-Ar$^2$, -L'-Ar$^2$—Ar$^2$, -L'-Ar$^2$—R$^8$, or -L'-Ar$^2$—Ar$^2$—R$^8$;

L', at each occurrence, is independently —O—, —Y—O—Y—, —S—, —S(O)—, —Y—S—Y—, —C(O)'—, —NR$^c$C(O)—, —NR$^c$—, —SiR$^c{}_2$—, —Y—[SiR$^c{}_2$]—Y—, a divalent C$_{1-20}$ alkyl group, a divalent C$_{1-20}$ alkenyl group, a divalent C$_{1-20}$ haloalkyl group, or a covalent bond;

Ar$^2$, at each occurrence, is independently a C$_{6-14}$ aryl group or a 5-14 membered heteroaryl group, each optionally substituted with 1-5 substituents selected from the group consisting of a halogen, —CN, a C$_{1-6}$ alkyl group, a C$_{1-6}$ alkoxy group, and a C$_{1-6}$ haloalkyl group;

R$^8$, at each occurrence, is a C$_{1-20}$ alkyl group, a C$_{2-20}$ alkenyl group, a C$_{1-20}$ haloalkyl group, or a C$_{1-20}$ alkoxy group;

Y, at each occurrence, is independently a divalent C$_{1-6}$ alkyl group, a divalent C$_{1-6}$ haloalkyl group, or a covalent bond;

R$^3$ and R$^4$, at each occurrence, are independently H, CN, a C$_{1-30}$ alkyl group, a C$_{2-30}$ alkenyl group, a C$_{1-30}$ haloalkyl group, or -L-R$^9$;

L, at each occurrence, is independently —O—, —Y—O—Y—, —S—, —S(O)—, —Y—S—Y—, —C(O)—, —NR$^{c'}$C(O)—, —NR$^{c'}$—, a divalent C$_{1-30}$ alkyl group, a divalent C$_{1-30}$ alkenyl group, a divalent C$_{1-30}$ haloalkyl group, or a covalent bond;

R$^{c'}$, at each occurrence, is H or a C$_{1-20}$ alkyl group;

R$^9$, at each occurrence, is independently a C$_{1-20}$ alkyl group, a C$_{2-20}$ alkenyl group, a C$_{1-20}$ haloalkyl group;

Y, at each occurrence, is independently a divalent C$_{1-6}$ alkyl group, a divalent C$_{1-6}$ haloalkyl group, or a covalent bond; and c is from 1 to 6.

2. The polymer of claim 1, comprising the repeating unit B, wherein the repeating unit A and the repeating unit B are in random order or in alternating order, and the number n of the repeating unit A and the repeating unit B is from 2 to 5000.

3. The polymer of claim 1, wherein the polymer is a homopolymer or alternating copolymer of general formula (I)

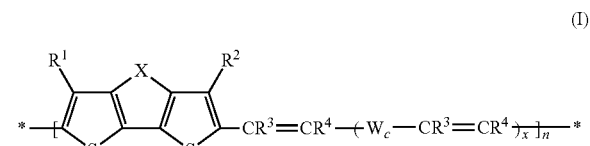

wherein Z, X, W$_c$, R$^1$, R$^2$, R$^3$ and R$^4$ are defined as in claim 1;

x is 0 or 1; and n is an integer greater than 1.

4. The polymer of claim 1, wherein sulfur$^5$ and R$^6$ are a C$_{1-30}$ alkyl, a C$_{1-30}$ haloalkyl or a C$_{2-30}$ alkenyl group.

5. The polymer of claim 1, wherein R$^1$, R$^2$, R$^3$ and R$^4$ are hydrogen.

6. The polymer of claim 1, wherein X is N(R$^5$) or Si(R$^5$R$^6$).

7. The polymer of claim 1, wherein:

W is an optionally substituted monocyclic, bicyclic or heterocyclic moiety selected from the group consisting of

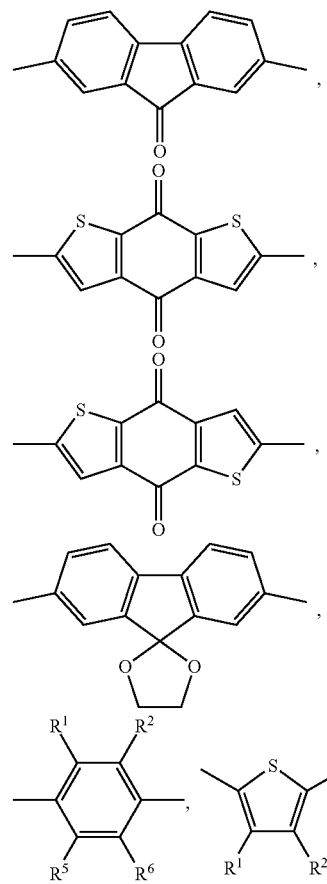

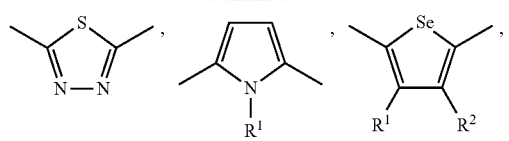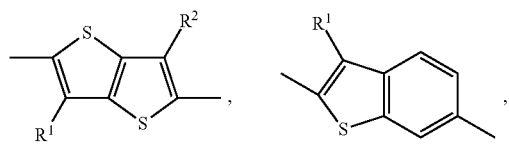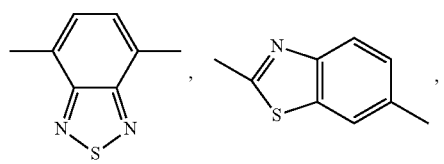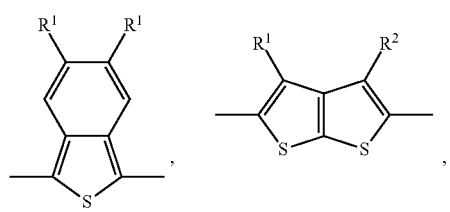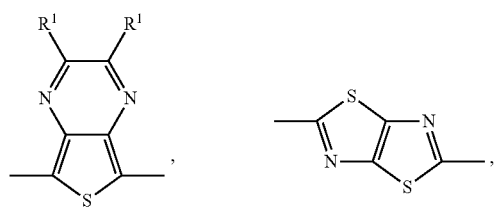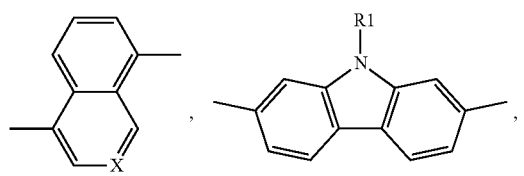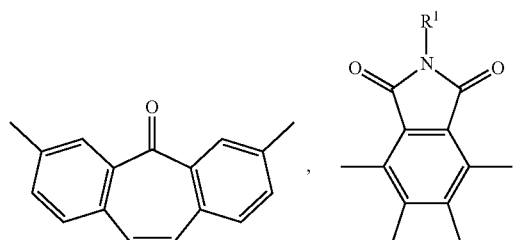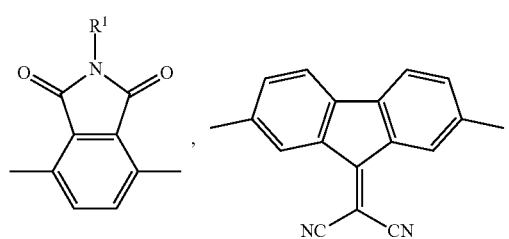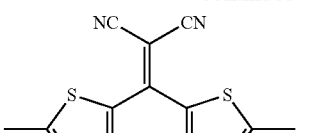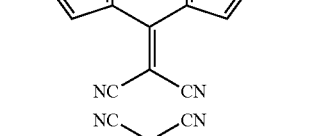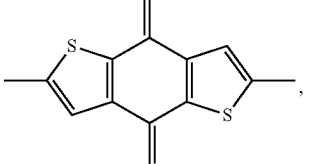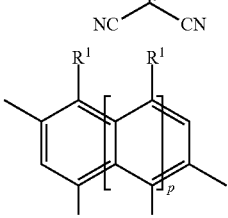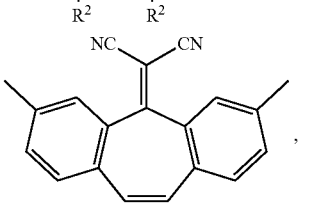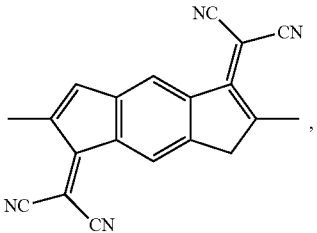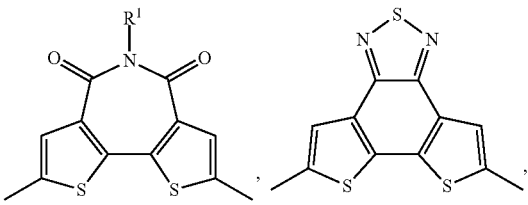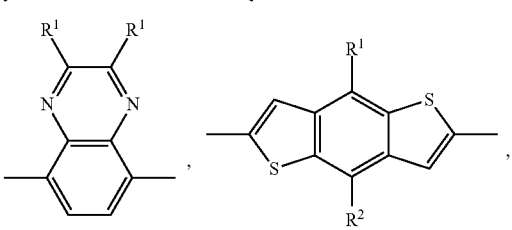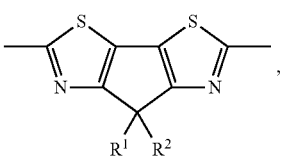

-continued
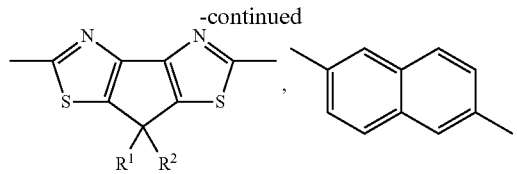
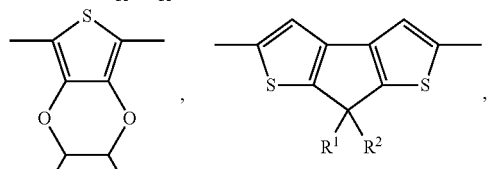
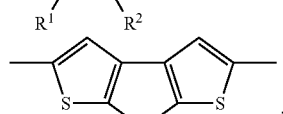
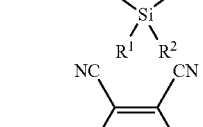
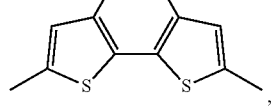
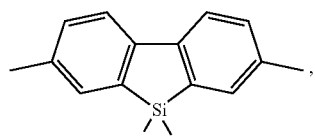
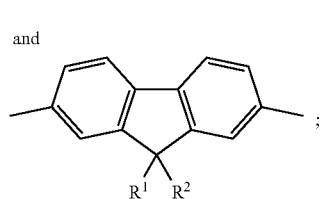
and
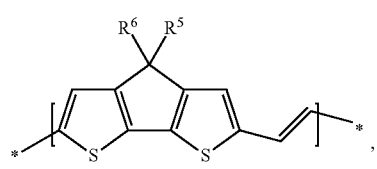
and
$R^1$, $R^2$, $R^5$ and $R^6$ are, at each occurrence, independently as defined in claim 1.
8. The polymer of claim 1, wherein n is an integer between 2 and 5000.
9. The polymer of claim 1, wherein:
the repeating unit A is selected from the group consisting of
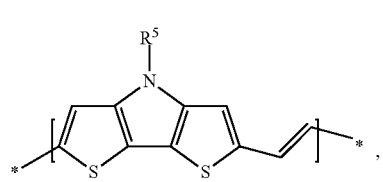   Ib
Ic
-continued
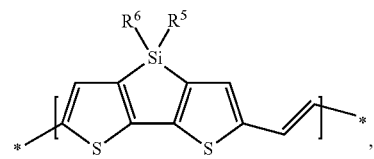   Id
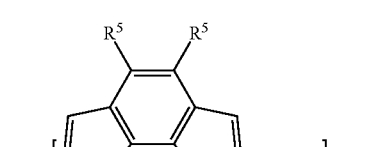   Ie
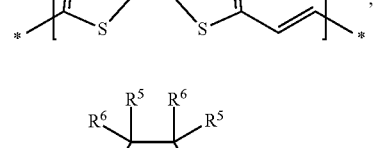   If
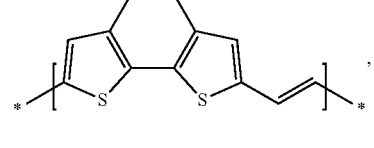   Ig
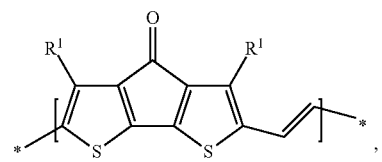   Ih
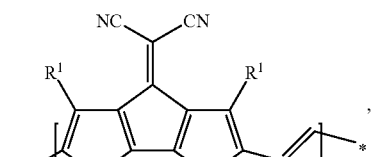   Ii
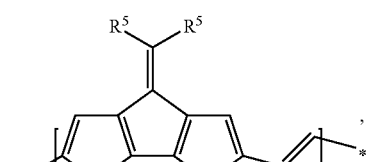   Ij
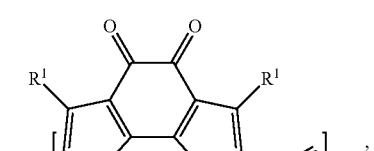   Ik
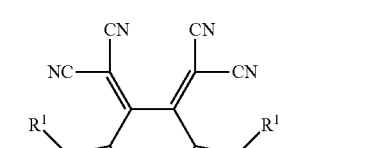

-continued

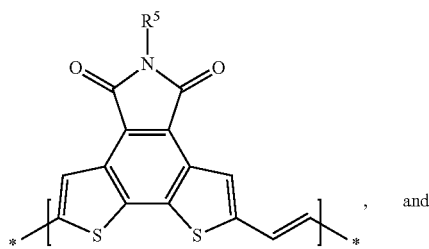, and

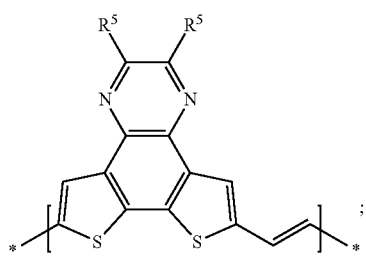;

and
R¹, R⁴ and R⁵ are defined as in claim 1.

10. The polymer of claim 1, wherein:
the repeating unit A is selected from the group consisting of

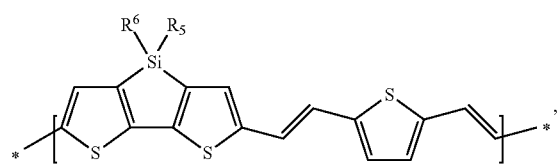,

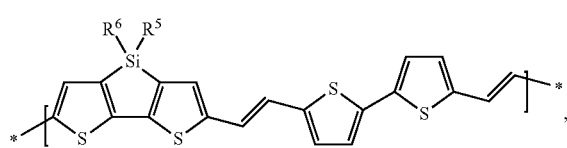,

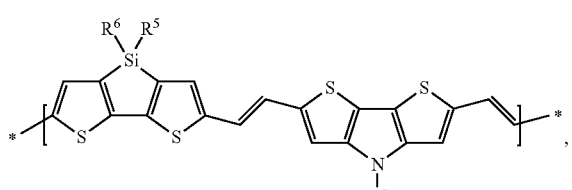,

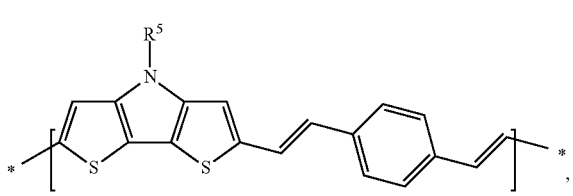,

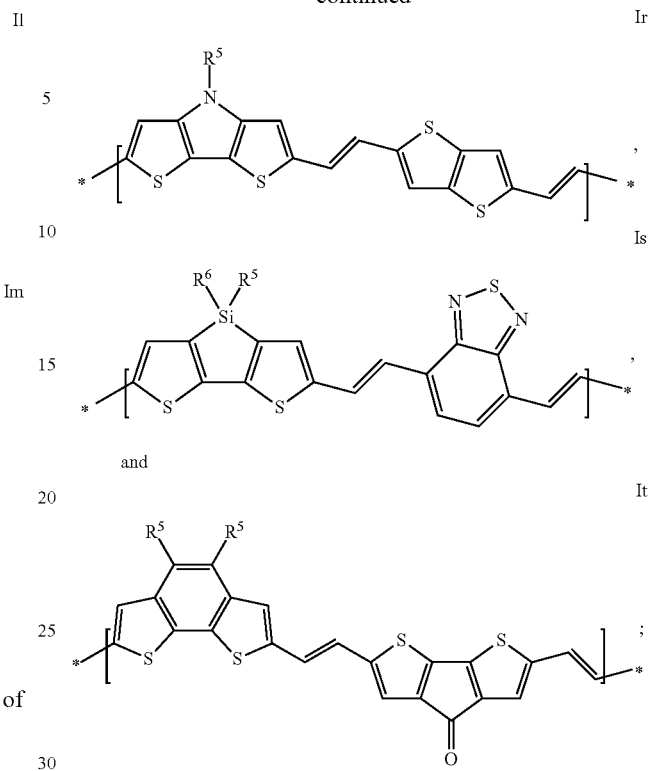

and
R⁴ and R⁵ are defined as claim 1.

11. A composition, comprising at least one polymer of claim 1 dissolved or dispersed in a liquid medium.

12. The composition of claim 11, wherein the liquid medium comprises water or an organic solvent and optionally at least one additive independently selected from the group consisting of a viscosity modulator, a detergent, a dispersant, a binding agent, a compatibilizing agent, a curing agent, an initiator, a humectant, an antifoaming agent, a wetting agent, a pH modifier, a biocide, and a bactereriostat.

13. A device, comprising at least one polymer of claim 1.

14. A thin film semiconductorm, comprising at least one polymer of claim 1.

15. A field effect transistor device, comprising the thin film semiconductor of claim 14.

16. The field effect transistor device of claim 15, wherein the field effect transistor has a structure selected from the group consisting of a top-gate bottom-contact structure, a bottom-gate top-contact, a structure, a top-gate top-contact structure, and a bottom-gate bottom-contact structure.

17. The field effect transistor device of claim 15, further comprising a dielectric material, wherein the dielectric material comprises an organic dielectric material, an inorganic dielectric material, or a hybrid organic/inorganic dielectric material.

18. A photovoltaic device, comprising the thin film semiconductor of claim 14.

19. An organic light emitting device, comprising the thin film semiconductor of claim 14.

* * * * *